US006544718B2

(12) United States Patent
Goto

(10) Patent No.: US 6,544,718 B2
(45) Date of Patent: Apr. 8, 2003

(54) SILVER HALIDE PHOTOGRAPHIC LIGHT-SENSITIVE MATERIAL AND METHOD FOR PROCESSING SAME

(75) Inventor: Takahiro Goto, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/015,686

(22) Filed: Dec. 17, 2001

(65) Prior Publication Data

US 2003/0022113 A1 Jan. 30, 2003

(30) Foreign Application Priority Data

Dec. 21, 2000 (JP) ....................................... 2000-388060

(51) Int. Cl.[7] .............................. G03F 7/06; G03C 1/76
(52) U.S. Cl. ..................................... 430/271.1; 430/523
(58) Field of Search ............................... 430/271.1, 523

(56) References Cited

U.S. PATENT DOCUMENTS 5,591,567 A 1/1997 Komatsu et al.

FOREIGN PATENT DOCUMENTS

| | | |
|---|---|---|
| JP | 02055348 | * 2/1990 |
| JP | 7-333779 | 12/1995 |
| JP | 11295848 | * 10/1999 |

OTHER PUBLICATIONS

Chemical Abstract 113:68285.*
Chemical Abstract 131:315790.*

* cited by examiner

*Primary Examiner*—Hoa Van Le
(74) *Attorney, Agent, or Firm*—Sughrue Mion, PLLC

(57) ABSTRACT

A silver halide photographic material comrises a support having first and second opposing surfaces, at least one light-sensitive emulsion layer that is provided on the first surface side, and a hydrophilic colloid layer that is provided on the second surface side, wherein the hydrophilic colloid layer comprises at least one compound represented by general formula (I) or general formula (II) below:

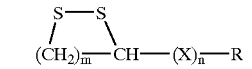

(I)

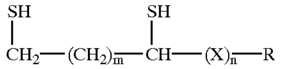

(II)

wherein X denotes a $C_1$ to $C_6$ divalent organic residue, R denotes a carboxylic acid group, a carboxylate salt group, a carboxylate ester group, or a carboxylic amide group, m is 2 or 3, and n is 0 or 1. Also disclosed is a method for continuously processing the photographic material, wherein the amount of developing solution that is replenished during development is 200 ml or less per $m^2$ of the photographic material.

18 Claims, 2 Drawing Sheets

SILVER HALIDE PHOTOGRAPHIC LIGHT-SENSITIVE MATERIAL AND METHOD FOR PROCESSING SAME

BACKGROUND OF THE INVENTION

1. Field of the Invention

The present invention relates to a silver halide photographic light-sensitive material, and more particularly to a silver halide photographic light-sensitive material for photomechanical plate-making that exhibits ultrahigh-contrast photographic characteristics.

2. Description of the Related Art

In the field of graphic arts, in order to improve the reproduction of continuous-tone images with halftone dot images or the reproduction of line images, image formation systems exhibiting ultrahigh-contrast photographic characteristics (particularly, a $\gamma$ of 10 or more) are required.

An image formation system capable of obtaining ultrahigh-contrast photographic characteristics by development with a processing solution that has good storage stability has been demanded. To cope with this demand, as described in U.S. Pat. Nos. 4,166,742, 4,168,977, 4,221,857, 4,224,401, 4,243,739, 4,272,606, and 4,311,781, a system for forming an ultrahigh-contrast negative image having a $\gamma$ value exceeding 10 was proposed. In the system, a surface latent image-type silver halide photographic light-sensitive material, having added thereto a specific acylhydrazine compound, is processed with a developer containing 0.15 mol/L or more of a sulfurous acid preservative and having a pH of from 11.0 to 12.3. This new system is characterized in that silver iodobromide or silver chloroiodobromide can be used, whereas only silver chlorobromide having a high silver chloride content can be used in a conventional ultrahigh-contrast image formation system. Further, the new system is characterized in that it can contain a large amount of sulfurous acid preservative, and relatively good storage stability is achieved, whereas use of only a very small amount of sulfurous acid preservative is allowed in conventional lith developers.

In European Unexamined Patent Publication (EP) 0 208 514A, JP-A-61-223734 ("JP-A" means unexamined published Japanese patent application), and JP-A-63-46437, high-contrast photographic light-sensitive materials containing two types of silver halide grains, and further containing a hydrazine derivative, are described.

JP-A-4-331951 describes, in its claim, a high-contrast light-sensitive material that comprises a hydrazine derivative and silver halide grains that have been subjected to dye sensitization at a higher concentration of a dye per unit surface area of the silver halide grains than other silver halide grains have. Further, British unexamined patent publication (GB-A) 9407599 describes, in its claim, a high-contrast light-sensitive material that comprises silver halide grains spectrally sensitized by a non-desorbable sensitizing dye, and silver halide grains not spectrally sensitized, and further a hydrazine derivative. In both cases, the spectrally sensitized light-sensitive grains and the spectrally unsensitized non-light-sensitive grains contribute to a silver image formed by image-wise exposure and development, due to the presence of the hydrazine derivative, thereby achieving a reduction in the amount of sensitizing dye and an improvement in the residual color, while maintaining both high sensitivity and high density.

Although these light-sensitive materials have excellent processing stability, contrast, sensitivity and residual color, they have the problem that a silver sludge is formed in a processing system which has a low level of developer replenishment.

BRIEF SUMMARY OF THE INVENTION

It is an object of the present invention to provide a silver halide photographic light-sensitive material that does not form a silver sludge even in a processing system which has a low level of developer replenishment. It is another object of the present invention to provide a processing method for continuously processing the above-mentioned silver halide photographic light-sensitive material.

The objects of the present invention have been accomplished as follows.

A first aspect of the present invention relates to a silver halide photographic light-sensitive material including a support having first and second opposing surfaces, at least one light-sensitive silver halide emulsion layer that is provided on the first surface side, and a hydrophilic colloid layer that is provided on the second surface side, wherein the hydrophilic colloid layer contains at least one compound represented by general formula (I) or general formula (II) below.

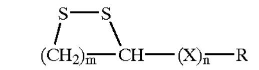
(I)

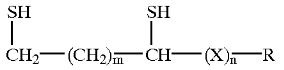
(II)

(In the formulae, X denotes a $C_1$ to $C_6$ divalent organic residue, R denotes a carboxylic acid group, a carboxylate salt group, a carboxylate ester group, or a carboxylic amide group, m is 2 or 3, and n is 0 or 1.)

The above-mentioned first surface side is also known as 'an emulsion layer side' or 'an emulsion surface side' to a person skilled in the art, and the above-mentioned second surface side is also known as 'a back layer side' or 'a back surface' to a person skilled in the art.

A second aspect of the present invention relates to a method for continuously processing the silver halide photographic light-sensitive material related to the first aspect, wherein the amount of developing solution that is replenished during development is 200 ml or less per $m^2$ of the light-sensitive material.

The above-mentioned objects, other objects, features, and advantages of the invention will become clear from the following description.

DETAILED DESCRIPTION OF THE INVENTION

Figure 1:
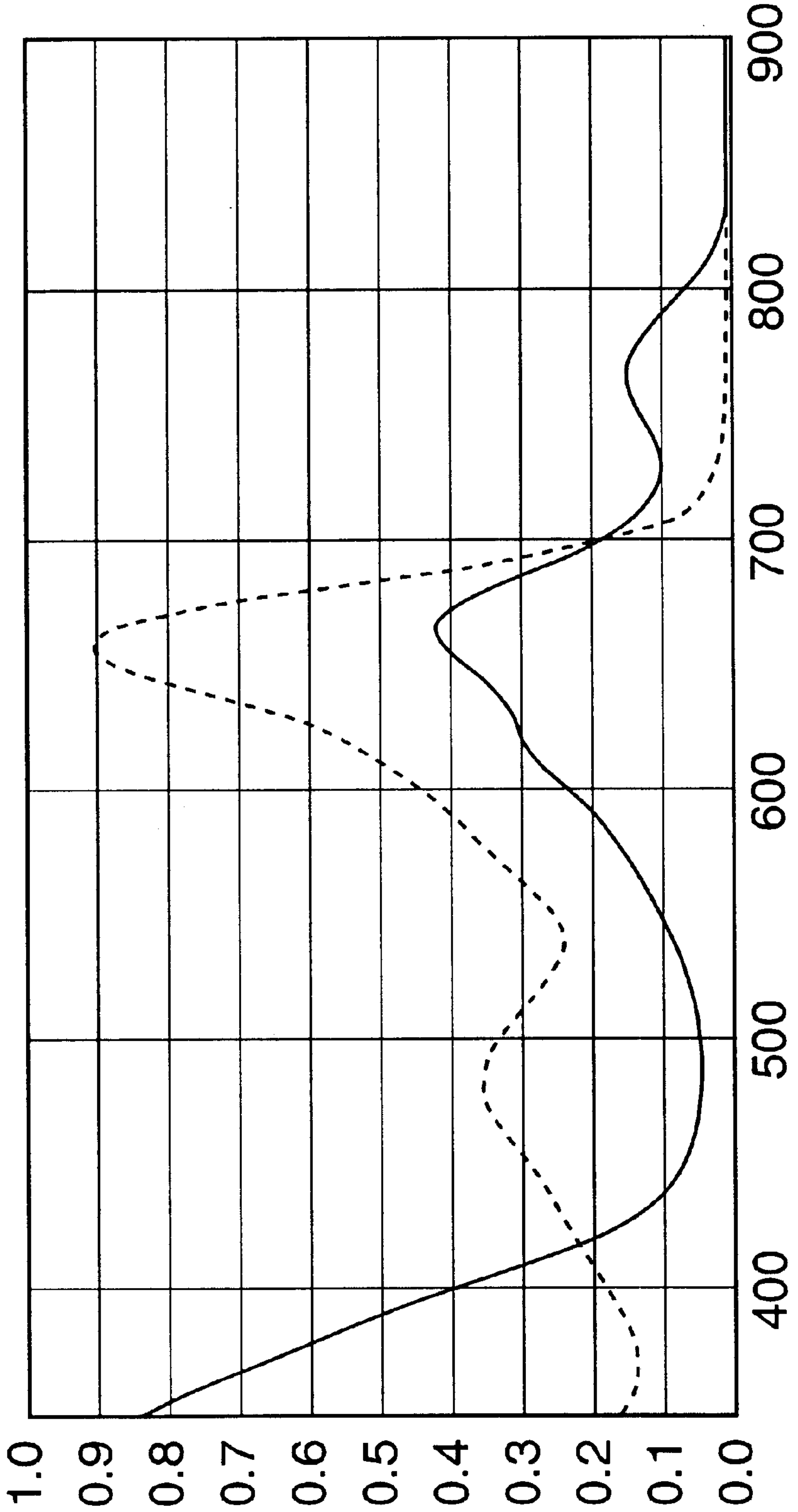
FIG. 1 shows absorption spectra of the emulsion layer side and the back layer side of a silver halide light-sensitive material of Example 1.

In FIG. 1, the ordinate denotes absorbance (interval 0.1) and the abscissa denotes wavelength from 350 nm to 950 nm. The solid line denotes the absorption spectrum of the emulsion layer side and the broken line denotes the absorption spectrum of the back layer side.

Figure 2:
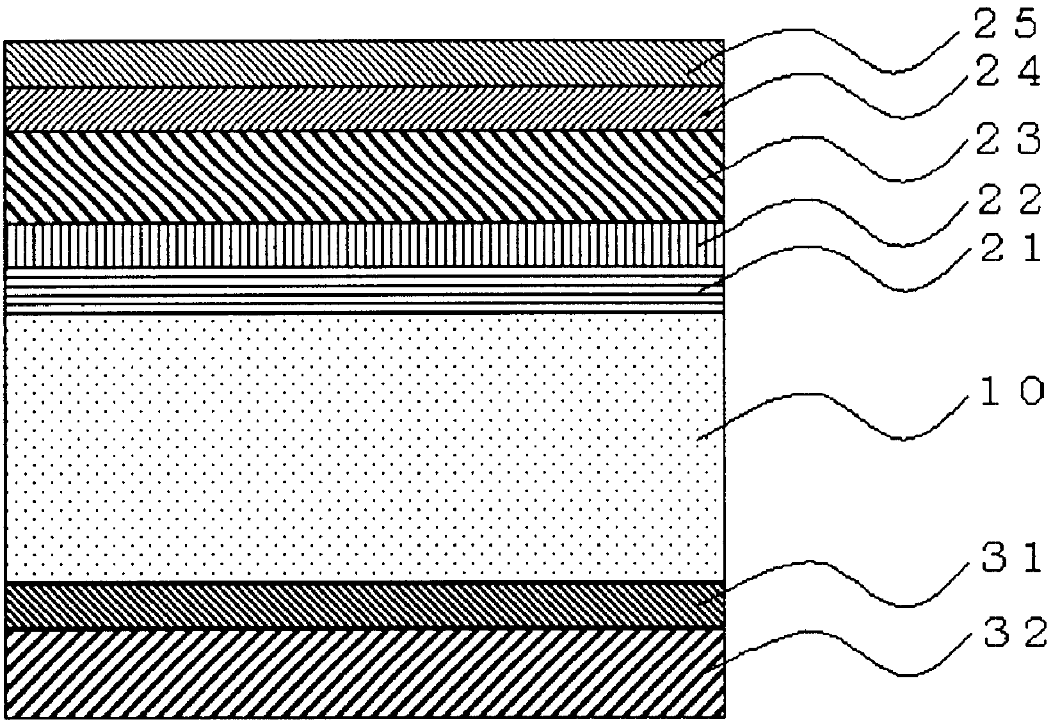
FIG. 2 is a schematic cross sectional view showing the layer structure of one embodiment of the photographic light-sensitive material related to the present invention.

In FIG. 2, a support 10 has first and second surfaces. On the first surface of the support, first and second undercoat layers 21, a UL layer 22, a light-sensitive silver halide emulsion layer 23, a lower protective layer 25, and an upper protective layer 25 are provided in this order. On the second surface of the support, an electrically conductive layer and a back layer (a hydrophilic colloid layer) are provided in this order.

General formulae (I) and (II) of the present invention are now explained in detail.

(I)

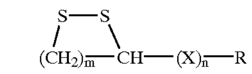

(II)

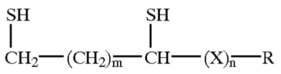

(In the formulae, X denotes a $C_1$ to $C_6$ divalent organic residue, R denotes a carboxylic acid group, a carboxylate salt group, a carboxylate ester group, or a carboxylic amide group, m is 2 or 3, and n is 0 or 1.)

With regard to preferable examples of X in general formula (I) and general formula (II), methylene, ethylene, propylene, butylene, and hexylene, can be cited. With regard to preferable examples of the carboxylate salt group represented by R, alkali metal salts (sodium, potassium, etc.), alkaline earth metal salts (calcium, barium, etc.), ammonium salts, and amine salts (methylamine, ethylamine, ethanolamine, etc.) can be cited. With regard to preferable examples of the carboxylate ester group, alkoxycarbonyl groups can be cited. With regard to preferable examples of the carboxylic amide group, $C_1$ to $C_{12}$ alkyl- or phenyl-substituted amides and a carbamyl group can be cited. The cabamyl group is more preferable.

Specific examples of the compounds of general formulae (I) and (II) that are particularly useful are listed below, but they are not intended to limit the scope of the invention.

I-1

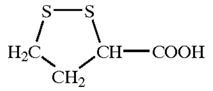

I-2

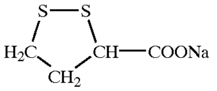

I-3

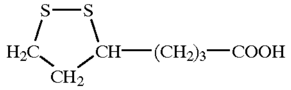

I-4

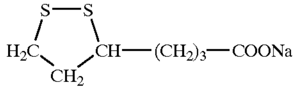

I-5

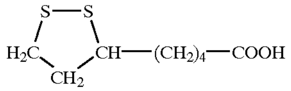

I-6

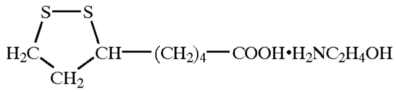

-continued

I-7

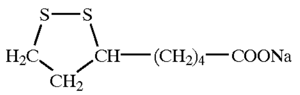

I-8

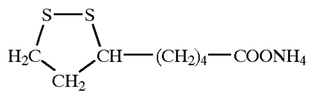

I-9

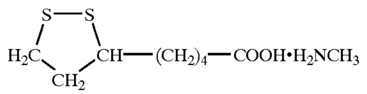

I-10

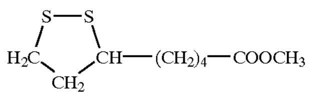

I-11

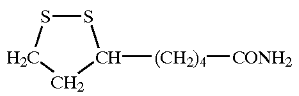

I-12

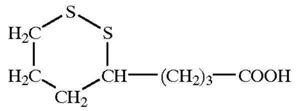

I-13

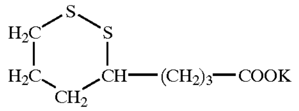

II-1

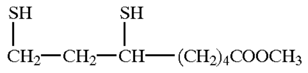

II-2

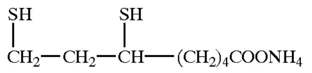

II-3

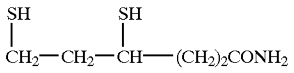

II-4

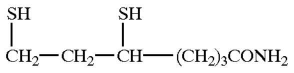

II-5

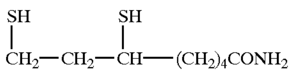

II-6

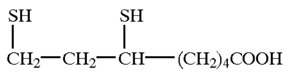

II-7

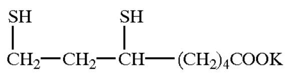

The compounds represented by general formulae (I) and (II) can be synthesized by a known method. For example, a method described in Journal of the American Chemical Society, Vol. 76, pp. 1828 to 1832 (1954) can be employed.

The layer to which a compound represented by general formulae (I) or (II) is added is a hydrophilic colloid layer that is on the side of the support opposite to the silver halide emulsion layer side. When it is added to the silver halide emulsion layer side, the formation of silver sludge is accelerated and the photographic performance is adversely affected. The amount of the compound added is $1\times10^{-5}$ mol/mol of silver to $1\times10^{-2}$ mol/mol of silver, preferably $1\times10^{-4}$ mol/mol of silver to $2\times10^{-3}$ mol/mol of silver, and particularly preferably $1\times10^{-4}$ mol/mol of silver to $5\times10^{-3}$ mol/mol of silver.

The halogen composition of the light-sensitive silver halide emulsion used in the present invention can be any chosen from silver chloride, silver bromide, silver chlorobromide, silver iodobromide, silver iodochloride and silver iodochlorobromide, and at least two types of silver halide emulsion having different halogen compositions are preferably present on the same side of the support in the present invention. With regard to the halogen compositions of said at least two types of silver halide emulsion, the silver bromide contents are preferably different by at least 10 mol %, the silver bromide content of at least one type of emulsion is 50 mol % or more, and the silver bromide content of another type of emulsion is 50 mol % or less.

The silver halide grains may have any shape of cubic, tetradecahedral, octahedral, amorphous, and tabular forms, and cubic or tabular grains are preferred.

The photographic emulsion for use in the present invention can be prepared using methods described, for example, by P. Glafkides, in Chimie et Physique Photographique, Paul Montel (1967); by G. F. Duffin, in Photographic Emulsion Chemistry, The Focal Press (1966); and by V. L. Zelikman et al., in Making and Coating Photographic Emulsion, The Focal Press (1964).

More specifically, either an acid process or a neutral process may be used. Further, a method of reacting a soluble silver salt and a soluble halogen salt may be carried out by any of a single-sided mixing method, a simultaneous mixing method, and a combination thereof.

A method of forming grains in the presence of excess silver ion (the so-called reverse-mixing method) may also be used. As one form of the simultaneous mixing method, a method of maintaining the pAg constant in the liquid phase where silver halide is produced, namely, the so-called controlled double jet method, may be used. Further, it is preferred to form the grains using a so-called silver halide solvent, such as ammonia, a thioether, or a tetra-substituted thiourea, and more preferably using a tetra-substituted thiourea compound, and this is described in JP-A-53-82408 and JP-A-55-77737. Preferred examples of the thiourea compound include tetramethylthiourea and 1,3-dimethyl-2-imidazolidinethione. The amount of silver halide solvent added varies depending on the kind of the compound used or the intended grain size and the intended halogen composition, but it is preferably from $10^{-5}$ to $10^{-2}$ mol per mol of silver halide. It is also possible to form grains in the presence of a nitrogen-containing heterocyclic compound capable of forming a complex with silver, and Compounds N-1 to N-59 described in JP-A-11-344788 are preferred. The amount of such a compound added varies depending on various conditions such as the pH, the temperature and the size of the silver halide grains, but it is preferably $10^{-6}$ to $10^{-2}$ mol per mol of silver halide. Such a compound can be added appropriately in any step prior to, during, or subsequent to formation of the grains, but it is preferably added during formation of the grains.

According to the controlled double jet method or the method of forming grains using a silver halide solvent, a silver halide emulsion including grains having a regular crystal form and a narrow grain size distribution can be easily prepared. These methods are useful means for preparing the silver halide emulsion for use in the present invention.

In order to render the grain size uniform, it is preferred to rapidly grow grains within the range not exceeding the critical saturation, using a method of changing the addition rate of silver nitrate or alkali halide according to the grain growth rate, as described in British Patent No. 1,535,016, JP-B-48-36890 ("JP-B" means examined Japanese patent publication), and JP-B-52-16364, or a method of changing the concentration of the aqueous solution, as described in British Patent No. 4,242,445 and JP-A-55-158124.

The emulsion for use in present invention is preferably a monodisperse emulsion having a coefficient of variation (deviation coefficient) obtained by the equation: {(standard deviation of grain size)/(average grain size)}×100, of 20% or less, and more preferably 15% or less. For convenience the grain size of the silver halide grains is represented by the length of the edge for cubic grains, and by the diameter of the circle corresponding to a projected area for other grains (octahedral, tetradecahedral, tabular forms, etc.).

The silver halide emulsion grains preferably have an average grain size of 0.5 μm or less, and more preferably 0.1 to 0.4 μm.

The light-sensitive silver halide emulsion in the present invention can be used singly or in a combination of two or more types. When a combination of two or more types is used, the grain sizes are preferably different from each other. The difference in grain size, as the average grain length, is preferably 10% or more.

The silver halide emulsion used in the present invention is preferably a mixture of at least two types of emulsion that have different amounts of at least one type of nitrogen-containing heterocyclic compound capable of forming a complex with silver.

The ratio of the two or more types of silver halide emulsion used in the present invention is not particularly limited. For example, the ratio of an emulsion having a smaller amount of the nitrogen-containing heterocyclic compound capable of forming a complex with silver and an emulsion having a larger amount thereof is 1:1 to 1:20 on the basis of the silver present in the silver halide emulsions, and more preferably 1:1 to 1:10.

The amounts added of the above-mentioned nitrogen-containing heterocyclic compound capable of forming a complex with silver may be different in terms of the total amounts immediately prior to mixing the emulsions. The difference in the amounts added, relative to the amount of silver present in the emulsion, of the nitrogen-containing heterocyclic compound capable of forming a complex with silver is at least 1.1 times, preferably at least 1.5 times, and more preferably at least 2 times.

The timing of the addition of the above-mentioned nitrogen-containing heterocyclic compound capable of forming a complex with silver to an emulsion is not particularly limited, and it can be added at any time: during formation of the silver halide emulsion grains, before post-ripening, after post-ripening or prior to coating.

With regard to the method of mixing the emulsions containing different amounts of the above-mentioned nitrogen-containing heterocyclic compound capable of forming a complex with silver, an emulsion having a smaller amount thereof can be added to an emulsion having a larger amount thereof, and vice versa.

Examples of the nitrogen-containing heterocycle of the nitrogen-containing heterocyclic compound capable of forming a complex with silver, for use in the present invention, include a pyrazole ring, a pyrimidine ring, a 1,2,4-triazole ring, a 1,2,3-triazole ring, a 1,3,4-thiadiazole ring, a 1,2,3-thiadiazole ring, a 1,2,4-thiadiazole ring, a 1,2,5-thiadiazole ring, a 1,2,3,4-tetrazole ring, a pyridazine ring, a 1,2,3-triazine ring, a 1,2,4-triazine ring, a 1,3,5-triazine ring, a benzotriazole ring, a benzimidazole ring, a benzothiazole ring, a quinoline ring, a benzoxazole ring, a benzoselenazole ring, a naphthothiazole ring, a naphthoimidazole ring, a rhodanine ring, a thiohydantoin ring, an oxazole ring, a thiazole ring, an oxadiazole ring, a selenadiazole ring, a naphthoxazole ring, an oxazolidinedione ring, a triazolotriazole ring, an azaindene ring (e.g. a diazaindene ring, a triazaindene ring, a tetrazaindene ring, a pentazaindene ring), a phthalazine ring, and an indazole ring.

Among these, compounds that each have an azaindene ring are preferred. Azaindene compounds that each have a hydroxyl group as a substituent are more preferred, such as hydroxytriazaindene compounds, tetrahydroxyazaindene compounds, and hydroxypentazaindene compounds. The heterocycle may have a substituent other than a hydroxyl group. Examples of the substituent include an alkyl group, an alkylthio group, an amino group, a hydroxyamino group, an alkylamino group, a dialkylamino group, an arylamino group, a carboxy group, an alkoxycarbonyl group, a halogen atom, an acylamino group, a cyano group, and a mercapto group.

Specific examples of the nitrogen-containing heterocyclic compound for use in the present invention are set forth below, but they are not intended to limit the scope of the invention.

(N-1) 2,4-Dihydroxy-6-methyl-1,3a,7-triazaindene
(N-2) 2,5-Dimethyl-7-hydroxy-1,4,7a-triazaindene
(N-3) 5-Amino-7-hydroxy-2-methyl-1,4,7a-triazaindene
(N-4) 4-Hydroxy-6-methyl-1,3,3a,7-tetrazaindene
(N-5) 4-Hydroxy-1,3,3a,7-tetrazaindene
(N-6) 4-Hydroxy-6-phenyl-1,3,3a,7-tetrazaindene
(N-7) 4-Methyl-6-hydroxy-1,3,3a,7-tetrazaindene
(N-8) 2,6-Dimethyl-4-hydroxy-1,3,3a,7-tetrazaindene
(N-9) 4-Hydroxy-5-ethyl-6-methyl-1,3,3a,7-tetrazaindene
(N-10) 2,6-Dimethyl-4-hydroxy-5-ethyl-1,3,3a,7-tetrazaindene
(N-11) 4-Hydroxy-5,6-dimethyl-1,3,3a,7-tetrazaindene
(N-12) 2,5,6-Trimethyl-4-hydroxy-1,3,3a,7-tetrazaindene
(N-13) 2-Methyl-4-hydroxy-6-phenyl-1,3,3a,7-tetrazaindene
(N-14) 4-Hydroxy-6-methyl-1,2,3a,7-tetrazaindene
(N-15) 4-Hydroxy-6-ethyl-1,2,3a,7-tetrazaindene
(N-16) 4-Hydroxy-6-phenyl-1,2,3a,7-tetrazaindene
(N-17) 4-Hydroxy-1,2,3a,7-tetrazaindene
(N-18) 4-Methyl-6-hydroxy-1,2,3a,7-tetrazaindene
(N-19) 7-Hydroxy-5-methyl-1,2,3,4,6-pentazaindene
(N-20) 5-Hydroxy-7-methyl-1,2,3,4,6-pentazaindene
(N-21) 5,7-Dihydroxy-1,2,3,4,6-pentazaindene
(N-22) 7-Hydroxy-5-methyl-2-phenyl-1,2,3,4,6-pentazaindene
(N-23) 5-Dimethylamino-7-hydroxy-2-phenyl-1,2,3,4,6-pentazaindene
(N-24) 1-Phenyl-5-mercapto-1,2,3,4-tetrazole
(N-25) 6-Aminopurine
(N-26) Benzotriazole
(N-27) 6-Nitrobenzimidazole
(N-28) 3-Ethyl-2-methylbenzothiazolium-p-toluenesulfonate
(N-29) 1-Methylquinoline
(N-30) Benzothiazole
(N-31) Benzoxazole
(N-32) Benzoselenazole
(N-33) Benzimidazole
(N-34) Naphthothiazole
(N-35) Naphthoselenazole
(N-36) Naphthoimidazole
(N-37) Rhodanine
(N-38) 2-Thiohydantoin
(N-39) 2-Thio-2,4-oxazolidinedione
(N-40) 3-Benzyl-2-mercaptobenzimidazole
(N-41) 2-Mercapto-1-methylbenzothiazole
(N-42) 5-(m-Nitrophenyl)tetrazole
(N-43) 2,4-Dimethylthiazole
(N-44) 1-Methyl-5-ethoxybenzothiazole
(N-45) 2-Methyl-β-naphthothiazole
(N-46) 1-Ethyl-5-mercaptotetrazole
(N-47) 5-Methylbenzotriazole
(N-48) 5-Phenyltetrazole
(N-49) 1-Methyl-2-mercapto-5-benzoylamino-1,3,5-triazole
(N-50) 1-Benzoyl-2-mercapto-5-acetylamino-1,3,5-triazole
(N-51) 2-Mercapto-3-aryl-4-methyl-6-hydroxypyrimidine
(N-52) 2,4-Dimethyloxazole
(N-53) 1-Methyl-5-phenoxybenzoxazole
(N-54) 2-Ethyl-β-naphthoxazole
(N-55) 2-Mercapto-5-aminothiadiazole
(N-56) 2-Mercapto-5-aminoxadiazole
(N-57) 2-Mercapto-5-aminoselenadiazole
(N-58) Sodium 3-(5-mercaptotetrazole)benzenesulfonate
(N-59) Sodium 3-(5-mercaptotetrazole)benzenecarboxylate The amount of nitrogen-containing heterocyclic compound that is added varies over a wide range depending on the size and composition of the silver halide grains, the ripening conditions, etc., and is 10 mg to 1000 mg, and particularly preferably 50 mg to 200 mg per mol of silver halide; it is preferable to add the compound in an amount such that it forms a single molecular layer to 10 molecular layers on the surface of the silver halide grains. The amount added can be changed by controlling the adsorption equilibrium state during ripening by changing the pH and/or the temperature. With regard to the method of adding the nitrogen-containing heterocyclic compound related to the present invention to an emulsion, the compound is dissolved in an appropriate solvent that does not adversely affect the emulsion (for example, water or an alkaline aqueous solution) and the solution can be added to the emulsion.

The silver halide emulsion used in the present invention can contain a metal that belongs to Group VIII of the periodic table. In order to achieve high contrast and low fog, it preferably contains a rhodium compound, an iridium compound, a ruthenium compound, a rhenium compound, a chromium compound, etc. A preferred example of these heavy metal compounds is a metal coordination complex, or a hexa-coordinate complex represented by the general formula below.

$$[M(NY)_mL_{6-m}]^{n-}$$

(In the formula, M is a heavy metal chosen from the group consisting of Ir, Ru, Rh, Re, Cr and Fe. L denotes a bridging ligand. Y is oxygen or sulfur. m=0, 1 or 2 and n=0, 1, 2 or 3.)

With regard to preferable examples of L, halide ligands (fluoride, chloride, bromide and iodide), a cyanide ligand, a cyanate ligand, a thiocyanate ligand, a selenocyanate ligand, a tellurocyanate ligand, acid ligands, and an aquo ligand can be cited. When an aquo ligand is present, it preferably occupies one ligand or two ligands.

In order to achieve high sensitivity, it is preferable for the silver halide emulsion to contain an iron compound, and it is particularly preferable for it to contain a metal coordination complex having a cyan ligand.

These compounds are used as a solution in water or an appropriate solvent. A method that is usually employed in order to stabilize a solution of the compound, that is to say, a method in which an aqueous solution of a hydrogen halide (for example, hydrochloric acid, hydrobromic acid or hydrofluoric acid) or an alkali halide (for example, KCl, NaCl, KBr or NaBr) is added can be employed. It is also possible to add and dissolve other silver halide grains which have been doped with the above-mentioned compounds.

Specific examples of the metal coordination complex are as follows.

1. $[Rh(H_2O)Cl_5]^{2-}$
2. $[RhCl_6]^{3-}$
3. $[Ru(NO)Cl_5]^{2-}$
4. $[RuCl_6]^{3-}$
5. $[Ru(H_2O)Cl_5]^{2-}$
6. $[Ru(NO)(H_2O)Cl_4]^{-}$
7. $[Ru_2Cl_{10}O]^{6-}$
8. $[Re(NO)Cl_5]^{2-}$
9. $[Ir(NO)Cl_5]^{2-}$
10. $[Ir(H_2O)Cl_5]^{2-}$
11. $[Re(H_2O)Cl_5]^{2-}$
12. $[RhBr_6]^{3-}$
13. $[ReCl_6]^{3-}$
14. $[IrCl_6]^{3-}$
15. $[Re(NS)Cl_4(SeCN)]^{2-}$
16. $[Cr(CN)_6]^{3-}$
17. $[Fe(CN)_6]^{3-}$

The amount of these compounds added is $1\times10^{-8}$ to $5\times10^{-6}$ mol per mol of silver in the silver halide emulsion, and preferably $5\times10^{-8}$ to $1\times10^{-6}$ mol.

Furthermore, the above-mentioned heavy metals can be used in combination. The distribution of the heavy metal in the silver halide grains is not particularly limited; it can be distributed uniformly or in a core-shell form in which the distribution differs between the surface and the interior, or the distribution can be changed continuously. The addition of these compounds can be carried out appropriately in any step of the production of the silver halide emulsion grains or prior to coating the emulsion, but it is particularly preferable to add them during the emulsion formation so as to incorporate them into the silver halide grains.

The silver halide emulsion for use in the present invention is preferably subjected to chemical sensitization. The chemical sensitization may be performed using a known method, such as sulfur sensitization, selenium sensitization, tellurium sensitization, or noble metal sensitization, and these sensitization methods may be used singly or in combination. When these sensitization methods are used in combination, a combination of sulfur sensitization and gold sensitization; a combination of sulfur sensitization, selenium sensitization, and gold sensitization; and a combination of sulfur sensitization, tellurium sensitization, and gold sensitization, are preferred.

The sulfur sensitization employed in the present invention is usually carried out by adding a sulfur sensitizer to the silver halide emulsion and stirring the mixture at a high temperature, and preferably at least 40° C., for a predetermined time. The sulfur sensitizer used may be a known compound, and examples thereof include, in addition to a sulfur compound present in gelatin, various types of sulfur compound such as thiosulfates, thioureas, thiazoles or rhodanines. Furthermore, sulfur sensitizers disclosed in U.S. Pat. Nos. 1,574,944, 2,410,689, 2,278,947, 2,728,668, 3,501,313, 3,656,955, German Patent No. 1,422,869, JP-B-56-24937, JP-A-55-45016, etc. can be used. Preferred sulfur compounds are thiosulfates and thiourea compounds.

The amount of sulfur sensitizer added varies depending on various conditions such as the pH and the temperature at the time of chemical ripening and the size of the silver halide grains, but it is preferably $10^{-7}$ to $10^{-2}$ mol, and more preferably $10^{-5}$ to $10^{-3}$ mol per mol of silver halide.

The selenium sensitizer for use in the present invention may be a known selenium compound. The selenium sensitization is generally performed by adding a labile and/or non-labile selenium compound and stirring the emulsion at a high temperature of 40° C. or higher for a predetermined time. Preferable examples of the labile selenium compound include the compounds described in JP-B-44-15748, JP-B-43-13489, and JP-A-4-25832, JP-A-4-109240, JP-A-4-324855, etc. Specific examples of the labile selenium compound include isoselenocyanates (e.g. aliphatic isoselenocyanates such as allyl isoselenocyanate), selenoureas, selenoketones, selenoamides, selenocarboxylic acids (e.g. 2-selenopropionic acids, 2-selenobutyric acids), selenoesters, diacylselenides (e.g. bis(3-chloro-2,6-dimethoxybenzoyl)selenide), selenophosphates, phosphine selenides, colloidal metal selenium, etc. The above-mentioned preferable types of labile selenium compound are not cited for restriction. A person skilled in the art generally understands that, with regard to a labile selenium compound as a sensitizer for a photographic emulsion, the structure of the compound is not important as long as the selenium is labile, and the organic moiety of a selenium sensitizer molecule has no function other than that of allowing selenium to be present in a labile form in an emulsion. In the present invention, a labile selenium compound defined by such a broad concept is advantageously used. With regard to the non-labile selenium compound used in the present invention, compounds described in JP-B-46-4553, JP-B-52-34492 and JP-B 52-34491 can be used. Specific examples of the non-labile selenium compound include selenious acid, potassium selenocyanide, selenazoles, quaternary salts of selenazoles, diaryl selenides, diary diselenides, dialkyl selenides, dialkyl diselenides, 2-selenazolidindione, 2-selenooxazolidinthione, and derivatives thereof. Particularly preferred are the compounds represented by formula (VIII) or (IX) of JP-A-4-324855.

Further, a low-decomposition-activity selenium compound can also be preferably used. The low-decomposition-activity selenium compound is a selenium compound such that, when a water/1,4-dioxane (1/1 by volume) mixed solution (pH: 6.3), containing 10 mmol of $AgNO_3$, 0.5 mmol of the selenium compound, and 40 mmol of 2-(N-morpholino)ethanesulfonic acid buffer, is reacted at 40° C., the half-life of the selenium compound is 6 hours or more. When determining the half-life, the selenium compound can be detected and analyzed using HPLC, etc. Preferred examples of the low-decomposition-activity selenium compound include Compounds SE-1 to SE-8 exemplified in JP-A-9-166841.

The tellurium sensitizer for use in the present invention is a compound for forming silver telluride, which is presumed to become a sensitization nucleus, on the surface of or inside a silver halide grain. The rate of formation of silver telluride in a silver halide emulsion can be examined according to a method described in JP-A-5-313284.

Specific examples of the tellurium sensitizer to be used include the compounds described in U.S. Pat. Nos. 1,623, 499, 3,320,069, and 3,772,031, British Patent Nos. 235,211, 1,121,496, 1,295,462, and 1,396,696, Canadian Patent No. 800,958, JP-A-4-204640, JP-A-4-271341, JP-A-4-333043, and JP-A-5-303157, J. Chem. Soc. Chem. Commun., 635 (1980); ibid., 1102 (1979); ibid., 645 (1979); J. Chem. Soc. Perkin. Trans., 1, 2191 (1980); S. Patai (compiler), The Chemistry of Organic Selenium and Tellurium Compounds, Vol.1 (1986); and ibid., Vol. 2 (1987). The compounds represented by formulae (II), (III), and (IV) of JP-A-5-313284 are particularly preferred.

The amount to be used of the selenium sensitizer or the tellurium sensitizer for use in the present invention varies depending on the silver halide grains used, the chemical ripening conditions, etc., but it is generally in the order of $10^{-8}$ to $10^{-2}$ mol, and preferably from $10^{-7}$ to $_{10}{}^{-3}$ mol, per mol of silver halide. The conditions of chemical sensitization in the present invention are not particularly restricted, but the pH is generally from 5 to 8, the pAg is generally from 6 to 11, and preferably from 7 to 10, and the temperature is generally from 40 to 95° C., and preferably from 45 to 85° C.

Examples of the noble metal sensitizer for use in the present invention include gold, platinum, palladium, and iridium, and a gold sensitizer is particularly preferred. With regard to the above-mentioned gold sensitizer, its gold oxidation state may be monovalent or trivalent, and a gold compound that is normally used as a gold sensitizer can be used. Representative examples of the gold sensitizer for use in the present invention include chloroauric acid, potassium chloroaurate, auric trichloride, potassium auric thiocyanate, potassium iodoaurate, tetracyanoauric acid, ammonium aurothiocyanate, pyridyl trichlorogold, and gold sulfide. The gold sensitizer can be used in an amount of approximately from $10^{-7}$ to $10^{-2}$ mol per mol of silver halide.

In the silver halide emulsion for use in the present invention, a cadmium salt, a sulfite, a lead salt, a thallium salt, etc. may also be present during the formation or physical ripening of the silver halide grains.

In the present invention, reduction sensitization may be employed. Examples of the reduction sensitizer to be used include stannous salts, amines, formamidine sulfinic acid, and silane compounds.

To the silver halide emulsion for use in the present invention, a thiosulfonic acid compound may be added, according to the method described in European Unexamined Patent Publication (EP) 293,917.

With regard to the silver halide emulsion in the light-sensitive material used in the present invention, two or more types of emulsion can be used in combination in a single layer, the emulsions having different types, distributions and contents of metal complex; different crystal habits and forms; different types, amounts added and sensitization conditions of chemical sensitizer; and different types, amounts added and spectral sensitization conditions of spectral sensitizer, and, moreover, such layers can be formed into a layered structure.

The light-sensitive silver halide emulsion for use in the present invention may be spectrally sensitized to light having a comparatively long wavelength such as blue light, green light, red light, or infrared light, by a sensitizing dye, according to the purpose for which the light-sensitive material is used. Examples of the sensitizing dye that can be used include a cyanine dye, a merocyanine dye, a complex cyanine dye, a complex merocyanine dye, a holopolar cyanine dye, a styryl dye, a hemicyanine dye, an oxonol dye, and a hemioxonol dye.

Useful sensitizing dyes for use in the present invention are described, for example, in Research Disclosure, Item 17643, IV-A, page 23 (December, 1978); ibid., Item 18341 X, page 437 (August 1979), and publications cited therein.

In particular, sensitizing dyes having a spectral sensitivity suitable for the spectral characteristics of various light sources in a scanner, an image setter, or a photomechanical process camera, can be advantageously selected.

For example, A) for an argon laser light source, Compounds (I)-1 to (I)-8 described in JP-A-60-162247, Compounds I-1 to I-28 described in JP-A-2-48653, Compounds I-1 to I-13 described in JP-A-4-330434, Compounds of Examples 1 to 14 described in U.S. Pat. No. 2,161,331, and Compounds 1 to 7 described in West German Patent No. 936,071; B) for a helium-neon laser light source and a red laser diode light source, Compounds I-1 to I-38 described in JP-A-54-18726, compounds I-1 to I-35 described in JP-A-6-75322, Compounds I-1 to I-34 described in JP-A-7-287338, and Compounds 2-1, 2-14, 3-1 to 3-14 and 4-1 to 4-6 described in JP 2822138 (JP denotes Japanese Examined Patent Publication); C) for an LED light source, Dyes 1 to 20 described in JP-B-55-39818, Compounds I-1 to I-37 described in JP-A-62-284343, Compounds I-1 to I-34 described in JP-A-7-287338, and Compounds 2-1 to 2-14, 3-1 to 3-14 and 4-1 to 4-6 described in JP 2822138; D) for a semiconductor laser light source, Compounds I-1 to I-12 described in JP-A-59-191032, Compounds I-1 to I-22 described in JP-A-60-80841, Compounds I-1 to I-29 described in JP-A-4-335342, and Compounds I-1 to I-18 described in JP-A-59-192242; and E) for a tungsten or xenon light source of a photomechanical camera, Compounds (1) to (19) represented by general formula (I) of JP-A-55-45015, Compounds 4-A to 4-S, Compounds 5-A to 5-Q, and Compounds 6-A to 6-T described in JP-A-6-242547, and Compounds I-1 to I-97 described, in Japanese Patent Application No. 9-160185 may be advantageously selected, but the present invention is not limited thereby.

These sensitizing dyes may be used singly or in combination, and a combination of sensitizing dyes is often used for the purpose of, particularly, supersensitization. In combination with the sensitizing dye, a dye which itself has no spectral sensitization effect, or a material that adsorbs substantially no visible light, but that exhibits supersensitization, may be incorporated into the emulsion.

Useful sensitizing dyes, combinations of dyes that exhibit supersensitization, and materials that show supersensitization are described, for example, in Research Disclosure, Vol. 176, 17643, page 23, Item IV-J (December 1978); JP-B-49-25500, JP-B-43-4933, JP-A-59-19032, and JP-A-59-192242.

The sensitizing dyes for use in the present invention may be used in a combination of two or more. The sensitizing dye may be added to a silver halide emulsion by dispersing it directly in the emulsion, or by dissolving it in a single or mixed solvent of such solvents as water, methanol, ethanol, propanol, acetone, methyl cellosolve, 2,2,3,3-tetrafluoropropanol, 2,2,2-trifluoroethanol, 3-methoxy-1-propanol, 3-methoxy-1-butanol, 1-methoxy-2-propanol or N,N-dimethylformamide, and then adding the solution to the emulsion.

Alternatively, the sensitizing dye may be added to the emulsion by a method disclosed in U.S. Pat. No. 3,469,987, in which a dye is dissolved in a volatile organic solvent, the solution is dispersed in water or a hydrophilic colloid, and the dispersion is added to the emulsion; a method disclosed, for example, in JP-B-44-23389, JP-B-44-27555, and JP-B-57-22091, in which a dye is dissolved in an acid, and the solution is added to the emulsion, or a dye is formed into an aqueous solution in the presence of an acid or base and then it is added to the emulsion; a method disclosed, for example, in U.S. Pat. Nos. 3,822,135 and 4,006,025, in which a dye is formed into an aqueous solution or a colloid dispersion in the presence of a surfactant, and the solution or dispersion is added to the emulsion; a method disclosed in JP-A-53-102733 and JP-A-58-105141, in which a dye is directly dispersed in a hydrophilic colloid, and the dispersion is added to the emulsion; or a method disclosed in JP-A-51-74624, in which a dye is dissolved using a compound capable of producing a red-shift, and the solution is added to the emulsion. Ultrasonic waves may also be used to form a solution.

The sensitizing dye for use in the present invention may be added to a silver halide emulsion for use in the present invention at any step known to be useful during the preparation of a photographic emulsion. For example, the dye may be added at a silver halide grain formation step, and/or in a period before desalting, or at a desalting step, and/or in a period after desalting and before the initiation of chemical ripening, as disclosed, for example, in U.S. Pat. Nos. 2,735,766, 3,628,960, 4,183,756, and 4,225,666, JP-A-58-184142, and JP-A-60-196749, or the dye may be added in any period or at any stage before coating of the emulsion, such as immediately before or during chemical ripening, or in a period after chemical ripening but before coating, as disclosed, for example, in JP-A-58-113920. Also, a single kind of compound alone, or a combination of compounds different in structure, may be added in a divided manner; for example, a part during grain formation, and the remainder during chemical ripening, or after completion of the chemical ripening; or a part before or during chemical ripening, and the remainder after completion of the chemical ripening, as disclosed, for example, in U.S. Pat. No. 4,225,666 and JP-A-58-7629. The kind of compounds added in a divided manner, or the kind of combination of compounds, may be changed.

The amount added of the sensitizing dye for use in the present invention varies depending upon the shape, size, the halogen composition of the silver halide grains, the method and degree of chemical sensitization, the kind of antifoggant, and the like, but the amount added can be from $4\times10^{-6}$ to $8\times10^{-3}$ mol per mol of silver halide. For example, when the silver halide grain size is from 0.2 to 1.3 $\mu$m, the amount added is preferably from $2.0\times10^{-7}$ to $3.5\times10^{-6}$, and more preferably from $6.5\times10^{-7}$ to $2.0\times10^{-6}$ mol, per $m^2$ of the surface area of the silver halide grains.

In the present invention it is preferable to use light-insensitive silver halide grains for the purpose of film detection in exposure equipment, etc. The light-insensitive silver halide is preferably in the form of monodisperse grains; its coefficient of variation obtained by the equation: {(standard deviation of grain size)/(average grain size)}×100, is 20% or less, and preferably 15% or less. The average size of these silver halide grains is preferably at least 0.1 $\mu$m, more preferably 0.2 $\mu$m to 10 $\mu$m, and yet more preferably 0.5 $\mu$m to 1.5 $\mu$m.

The light-insensitive silver halide grains of the present invention have a blue region sensitivity that is 1/10 or less of that of the light-sensitive silver halide grains used in the light-sensitive material of the present invention, and are preferably not spectrally sensitized. The light-insensitive silver halide grains of the present invention can be subjected to surface modification such as metal complex doping or chemical sensitization, described in the section above related to light-sensitive silver halides.

Although the amount of light-insensitive silver halide grains used in the present invention depends on the grain size, it is an amount such that the spectral transmittance of the light-sensitive material at 900 nm to 950 nm is reduced by at least 3% on average by the addition of the light-insensitive silver halide grains. The amount on a silver basis is 10 to 500 mg/$m^2$, and preferably 10 to 200 mg/$m^2$. The spectral transmittance at 900 nm to 950 nm can be measured using a general spectrometer. For example, it can be measured using a spectrometer model U3500 manufactured by Hitachi, Ltd. with an integrating sphere in the light-receiving section thereof and placing a light-sensitive material sample at the entrance of the integrating sphere.

With regard to the support used in the present invention, for example, baryta paper, polyethylene coated paper, polypropylene synthetic paper, glass plate, cellulose acetate, cellulose nitrate, a polyester film such as polyethylene terephthalate, a support made of a styrene system polymer having a syndiotactic structure described in JP-A-7-234478 or U.S. Pat. No. 5,558,979, and a support, described in JP-A-64-538 or U.S. Pat. Nos. 4,645,731, 4,933,267 or 4,954,430 formed by coating a polyester film with a vinylidene chloride copolymer can be cited. These supports are chosen as appropriate according to the purpose for which the silver halide photographic light-sensitive material is used.

As a binder for the silver halide emulsion layer and another hydrophilic colloid layer of the present invention, gelatin is preferably used, but it is also possible to use a polymer described in paragraph 0025 of JP-A-10-268464. The amount of binder present in the whole hydrophilic colloid layer on the side having the silver halide emulsion layer is 3 g/$m^2$ or less (preferably 1.0 to 3.0 g/$m^2$), and the total amount of binder present in the whole hydrophilic colloid layer on the side having the silver halide emulsion layer and the whole hydrophilic colloid layer on the opposite side is 7.0 g/$m^2$ or less, and preferably 2.0 to 7.0 g/$m^2$.

In the present invention, in order to control the surface roughness of the outermost layers of the silver halide light-sensitive material, inorganic and/or organic polymer fine particles (hereinafter, called a matting agent) are used in a hydrophilic colloid layer. The surface roughness of the outermost layer on the side having the silver halide emulsion layer of the light-sensitive material and the surface roughness of the outermost layer on the opposite side can be controlled by variously changing the average particle size of the matting agent and the amount thereof added. The layer to which the matting agent is added can be any of the light-sensitive material forming layers, but with regard to the side having the silver halide emulsion layer, it is preferable to add it to a layer positioned far from the support in order to prevent pinholes, and the outermost layer is particularly preferred.

The matting agent used in the present invention can be of any type of solid particles as long as it does not adversely affect the various photographic characteristics. Specific examples include those described in paragraph Nos. 0009 to 0013 of JP-A-10-268464.

The average particle size of the matting agent used in the present invention is preferably 20 $\mu$m or less, and particularly preferably in the range of 1 to 10 μm. The amount of matting agent added is preferably 5 to 400 $mg/m^2$, and particularly preferably 10 to 200 $mg/m^2$.

With regard to the surface roughness of the light-sensitive material of the present invention, at least one of the outermost surfaces of the side having the emulsion layer, and the side opposite thereto, and preferably both surfaces, have a Bekk smoothness of 4000 s or less, and preferably 10 to 4000 s. The Bekk smoothness can be easily determined in accordance with JIS P8119 and TAPPI T479.

In the present invention, in order to improve settling of the matting agent when coating and drying the silver halide light-sensitive material and improve pressure induced sensitivity modification, curl balance, abrasion resistance and adhesion resistance during automatic transfer, exposure, development, etc., colloidal inorganic particles can be used in the silver halide emulsion layer, a middle layer, a protective layer, a back layer, a back protective layer, etc. Preferable examples of the colloidal inorganic particles include elongated silica particles described in paragraphs 0008 to 0014 of JP-A-10-268464, colloidal silica, and the pearl-like (pearl necklace form) colloidal silica 'Snowtex PS' manufactured by Nissan Chemical Industries, Ltd.

The amount of colloidal inorganic particles used in the present invention is 0.01 to 2.0 as a ratio by dry weight relative to the binder (e.g. gelatin) that is present in the layer to which they are to be added, and preferably 0.1 to 0.6.

In the present invention in order to improve the pressure induced sensitivity modification, etc., it is preferable to use the polyhydroxybenzene compounds described on page 10, lower right, line 11 to page 12, lower left, line 5 of JP-A-3-39948. More specifically, compounds (III)-1 to (III)-25 in the above specification can be cited.

In the present invention, in order to improve brittleness, dimensional stability, pressure induced sensitivity modification, etc. a polymer latex can be used. With regard to examples of the polymer latex, there are polymer latexes formed from various types of monomer such as an alkyl acrylate and an alkyl methacrylate described in U.S. Pat. Nos. 2,763,652 and 2,852,382, JP-A-64-538, JP-A-62-115152, JP-A-5-66512 and JP-A-5-80449, JP-B-60-15935, 6-64048 and 5-45014, etc. and polymer latexes formed by copolymerizing a monomer having an activated methylene group and a monomer such as an alkyl acrylate described in JP-B-45-5819 and JP-B-46-22507, JP-A-50-73625, JP-A-7-152112 and JP-A-8-137060, etc. Particularly preferred are polymer latexes having a core/shell structure, the shell structure having a repeating unit formed from an ethylenically unsaturated monomer containing an active methylene group, described in JP-A-8-248548, JP-A-8-208767 and JP-A-8-220669, etc. These core/shell structure polymer latexes having an active methylene group in the shell part can improve properties such as brittleness, dimensional stability and adhesion resistance between photographic light-sensitive materials without degrading the wet film strength of the light-sensitive material, and the shear stability of the latexes themselves can also be enhanced.

The amount of polymer latex used is 0.01 to 4.0 as a ratio by dry weight relative to the binder (e.g. gelatin) that is present in the layer to which the latex is added, and preferably 0.1 to 2.0.

In the present invention, in order to decrease the pH of the coated film for the purpose of improving the storage stability, pressure induced sensitivity modification, etc. of the silver halide light-sensitive material, it is preferable to use an acidic polymer latex described on page 14, left column, line 1 to right column, line 30 of JP-A-7-104413. More specifically, compounds II-1) to II-9) described on page 15 of the above specification and compounds having an acid group described on page 18, lower right, line 6 to page 19, upper left, line 1 of JP-A-2-103536 can be cited.

The pH of the coated film on the side having the silver halide emulsion layer is preferably 6 to 4.

At least one of the layers forming the silver halide light-sensitive material of the present invention can be an electrically conductive layer having a surface resistivity at 25° C. and 25% RH of $10^{12}$ Ω or less.

With regard to an electrically conductive material that is present in the electrically conductive layer used in the present invention, there are the electrically conductive materials described on page 2, lower left, line 13 to page 3, upper right, line 7 of JP-A-2-18542. More specifically, metal oxides described on page 2, lower right, line 2 to line 10 of the above specification, electrically conductive macromolecular compounds P-1 to P-7 described in the above specification, and acicular metal oxides described in U.S. Pat. No. 5,575,957, paragraphs 0034 to 0043 of JP-A-10-142738 and paragraphs 0013 to 0019 of JP-A-11-23901 can be used.

In the present invention, in addition to the above-mentioned electrically conductive material, the fluorine-containing surfactants described on page 4, upper right, line 2 to page 4, lower right, line 3 from the bottom of JP-A-2-18542 and page 12, lower left, line 6 to page 13, lower right, line 5 of JP-A-3-39948 can be used, thereby further improving the antistatic properties.

The silver halide emulsion layer or another hydrophilic colloid layer of the present invention can contain a coating aid, a dispersing and solubilizing agent for additives and various types of surfactant in order to enhance lubrication, prevent adhesion, improve the photographic characteristics (for example, development acceleration, hard gradation enhancement, sensitization, storage stability), etc. For example, there are surfactants described on page 9, upper right, line 7 to lower right, line 3 of JP-A-2-12236, PEG system surfactants described in page 18, lower left, lines 4 to 7 of JP-A-2-103536 and, more specifically, Compounds VI-1 to VI-15 described in the above specification, and fluorine-containing surfactants described on page 4, upper right, line 2 to lower right, line 3 from the bottom of JP-A-2-18542 and on page 12, lower left, line 6 to page 13, lower right, line 5 of JP-A-3-39948.

Furthermore, various types of slip agent can be used in the present invention in order to improve abrasion resistance, pressure induced sensitivity modification and transport performance of the silver halide light-sensitive material in an automatic transporter. For example, slip agents described on page 19, upper left, line 15 to upper right, line 15 of JP-A-2-103536 and in paragraphs 0006 to 0031 of JP-A-4-214551 can be cited.

With regard to a plasticizer for a coated film of the silver halide light-sensitive material of the present invention, Compounds described on page 19, upper left, line 12 to upper right, line 15 of JP-A-2-103536 can be used.

With regard to a cross-linking agent for the hydrophilic binders used in the emulsion layer and the protective layer, compounds described on page 18, upper right, line 5 to line 17 of JP-A-2-103536 and paragraphs 0008 to 0011 of JP-A-5-297508 can be used.

The percentage swelling of the hydrophilic colloid layers including the emulsion layer and the protective layer of the silver halide photographic light-sensitive material of the present invention is preferably in the range of 50 to 200%, and more preferably in the range of 70 to 180%. The percentage swelling of hydrophilic colloid layers is determined by measuring the thickness (d0) of the hydrophilic colloid layers including the emulsion layer and the protective layer in the silver halide photographic light-sensitive material, immersing the silver halide photographic light-sensitive material in distilled water at 25° C. for 1 minute, measuring the thickness increase (Δd) and calculating the percentage swelling (%) using the formula (Δd/d0)×100.

The process, environment, and heat treatment for post-coating drying of the silver halide light-sensitive material of the present invention and winding up into roll form after drying are determined according to the method described in paragraphs 0026 to 0032 of JP-A-10-268464.

The light-sensitive material of the present invention is preferably subjected to a heat treatment at any time after coating and prior to development. The heat treatment can be carried out immediately after coating or after a certain period has passed, but it is preferably carried out after a short time, for example, within 1 day. The heat treatment is carried out mainly in order to promote hardening so as to make the film strength sufficient to withstand development. The heat treatment conditions should be determined appropriately according to the type of hardening agent, the amount thereof added, the pH of the film, the required film strength, etc. The heat treatment is preferably carried out at 30 to 60° C., and more preferably 35 to 50° C., preferably for 30 minutes to 10 days.

In the present invention, as a nucleating agent at least one type of hydrazine derivative represented by general formula (D) is preferably used. General formula (D)

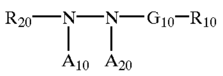

In the formula, $R_{20}$ represents an aliphatic group, an aromatic group, or a heterocyclic group; $R_{10}$ represents a hydrogen atom or a blocking group; $G_{10}$ represents a —CO—, —COCO—, —C(=S)—, —$SO_2$—, —SO—, or —$PO(R_{30})$— group (in which $R_{30}$ is selected from the same range of groups as defined for $R_{10}$ above, and $R_{30}$ and $R_{10}$ may be the same or different), or an iminomethylene group; $A_{10}$ and $A_{20}$ each represent a hydrogen atom, or one of them is a hydrogen atom and the other is a substituted or unsubstituted alkylsulfonyl group, a substituted or unsubstituted arylsulfonyl group, or a substituted or unsubstituted acyl group.

In formula (D), the aliphatic group represented by $R_{20}$ is preferably a substituted or unsubstituted straight-chain, branched-chain, or cyclic alkyl, alkenyl, or alkynyl group, each having 1 to 30 carbon atoms.

In formula (D), the aromatic group represented by $R_{20}$ is a monocyclic or condensed-ring aryl group. Examples of the ring include a benzene ring and a naphthalene ring. The heterocyclic group represented by $R_{20}$ is a monocyclic or condensed-ring, saturated or unsaturated, aromatic or non-aromatic heterocyclic group. Examples of the ring include a pyridine, a pyrimidine, an imidazole, a pyrazole, a quinoline, an isoquinoline, a benzimidazole, a thiazole, a benzothiazole, a piperidine, and a triazine ring. $R_{20}$ is preferably an aryl group, and especially preferably a substituted phenyl group, which will be described below.

$R_{20}$ may be substituted with a substituent. Typical examples of the substituent include a halogen atom (fluorine, chlorine, bromine, or iodine), an alkyl group, which includes an aralkyl group, a cycloalkyl group, and an active methine group; an alkenyl group, an alkynyl group, an aryl group, a heterocyclic group, a quarternized nitrogen atom-containing heterocyclic group (e.g. a pyridinio group), an acyl group, an alkoxycarbonyl group, an aryloxycarbonyl group, a carbamoyl group, a carboxyl group or a salt thereof, a sulfonylcarbamoyl group, an acylcarbamoyl group, a sulfamoylcarbamoyl group, a carbazoyl group, an oxalyl group, an oxamoyl group, a cyano group, a thiocarbamoyl group, a hydroxy group; an alkoxy group, which group contains a group containing a repeating unit of an ethyleneoxy group or a propyleneoxy group; an aryloxy group, a heterocyclic oxy group, an acyloxy group, an (alkoxy or aryloxy)carbonyloxy group, a carbamoyloxy group, a sulfonyloxy group, an amino group, an (alkyl, aryl, or heterocyclic)amino group, an N-substituted nitrogen-containing heterocyclic group, an acylamino group, a sulfonamido group, a ureido group, a thioureido group, an isothioureido group, an imido group, an (alkoxy or aryloxy)-carbonylamino group, a sulfamoylamino group, a semicarbazido group, a thiosemicarbazido group, a hydrazino group, a quaternary ammonio group, an oxamoyl amino group, an (alkyl or aryl)sulfonylureido group, an acylureido group, an N-acylsulfamoylamino group, a nitro group, a mercapto group, an (alkyl, aryl, or heterocyclic)-thio group, an (alkyl, or aryl)sulfonyl group, an (alkyl or aryl)sulfinyl group, a sulfo group or a salt thereof, a sulfamoyl group, an N-acylsulfamoyl group, a sulfonylsulfamoyl group or a salt thereof, and a group having a phosphonamide or phosphate structure.

These substituents may be further substituted by any of the above substituents.

Preferable examples of the substituent that $R_{20}$ may have include an alkyl group having 1 to 30 carbon atoms, wherein an active methylene group is included; an aralkyl group, a heterocyclic group, a substituted amino group, an acylamino group, a sulfonamido group, a ureido group, a sulfamoylamino group, an imido group, a thioureido group, a phosphonamide group, a hydroxyl group, an alkoxy group, an aryloxy group, an acyloxy group, an acyl group, an alkoxycarbonyl group, an aryloxycarbonyl group, a carbamoyl group, a carboxyl group or a salt thereof, an (alkyl, aryl, or heterocyclic)thio group, a sulfo group or a salt thereof, a sulfamoyl group, a halogen atom, a cyano group, and a nitro group.

In formula (D), $R_{10}$ represents a hydrogen atom or a blocking group, and specific examples of the blocking group include an alkyl group, an alkenyl group, an alkynyl group, an aryl group, a heterocyclic group, an alkoxy group, an aryloxy group, an amino group, and a hydrazino group.

The alkyl group represented by $R_{10}$ is preferably an alkyl group having 1 to 10 carbon atoms. Specific examples of the alkyl group include a methyl group, a trifluoromethyl group, a difluoromethyl group, a 2-carboxytetrafluoroethyl group, a pyridiniomethyl group, a difluoromethoxymethyl group, a difluorocarboxymethyl group, a 3-hydroxypropyl group, a methanesulfonamidomethyl group, a benzensulfonamidomethyl group, a hydroxymethyl group, a methoxymethyl group, a methylthiomethyl group, a phenylsulfonylmethyl group, and an o-hydroxybenzyl group. The alkenyl group is preferably an alkenyl group having 1 to 10 carbon atoms. Examples of the alkenyl group include a vinyl group, a 2,2-dicyanovinyl group, a 2-ethoxycarbonylvinyl group, and a 2-trifluoro-2-methoxycarbonylvinyl group. The alkynyl group is preferably an alkynyl group having 1 to 10 carbon atoms. Examples of the alkynyl group include an ethynyl group and a 2-methoxycarbonylethynyl group. The aryl group is preferably a monocyclic or condensed-ring aryl group, and especially preferably an aryl group containing a benzene ring. Examples of the aryl group include a phenyl group, a 3,5-dichlorophenyl group, a 2-methanesulfonamidophenyl group, a 2-carbamoylphenyl group, a 4-cyanophenyl group, and a 2-hydroxymethylphenyl group. The heterocyclic group is preferably a 5- or 6-membered, saturated or unsaturated, monocyclic or condensed-ring heterocyclic group that contains at least one nitrogen, oxygen, or sulfur atom. Examples of the heterocyclic group include a morpholino group, a piperidino group (N-substituted), a piperazino group, an imidazolyl group, an indazolyl group (e.g. a 4-nitroindazolyl group), a pyrazolyl group, a triazolyl group, a benzimidazolyl group, a tetrazolyl group, a pyridyl group, a pyridinio group (e.g. an N-methyl-3-pyridinio group), a quinolinio group, and a quinolyl group. Among these, especially preferred are a morpholino group, a piperidino group, a pyridyl group, a pyridinio group, and an indazolyl group.

The alkoxy group is preferably an alkoxy group having 1 to 8 carbon atoms. Examples of the alkoxy group include a methoxy group, a 2-hydroxyethoxy group, and a benzyloxy group. The aryloxy group is preferably a phenyloxy group. The amino group is preferably an unsubstituted amino group, an alkylamino group having 1 to 10 carbon atoms, an arylamino group, or a saturated or unsaturated heterocyclic amino group, wherein a quarternized nitrogen atom-containing heterocyclic group is included. Examples of the amino group include a 2,2,6,6-tetramethylpiperidin-4-ylamino group, a propylamino group, a 2-hydroxyethylamino group, an anilino group, an o-hydroxyanilino group, a 5-benzotriazolylamino group, and an N-benzyl-3-piridinioamino group. The hydrazino group is especially preferably a substituted or unsubstituted hydrazino group, or a substituted or unsubstituted phenylhydrazino group (e.g. a 4-benzenesulfonamidophenylhydrazino group).

These groups represented by $R_{10}$ may have a substituent. Preferable examples of the substituent are the same as those mentioned as the substituent of $R_{20}$.

In formula (D), $R_{10}$ may be an atomic group capable of splitting part of —$G_{10}$—$R_{10}$ from the remainder of the molecule, and a cyclization reaction subsequently taking place by which a cyclic structure containing atoms of the —$G_{10}$—$R_{10}$ part is formed. Examples of the atomic groups include those described, for example, in JP-A-63-29751.

The hydrazine derivatives represented by formula (D) may contain an adsorbing group capable of being adsorbed onto the silver halide. Examples of the adsorbing group include an alkylthio group, an arylthio group, a thiourea group, a thioamide group, a mercapto heterocyclic group, and a triazole group, described in U.S. Pat. Nos. 4,385,108 and 4,459,347, JP-A-59-195233, JP-A-59-200231, JP-A-59-201045, JP-A-59-201046, JP-A-59-201047, JP-A-59-201048, JP-A-59-201049, JP-A-61-170733, JP-A-61-270744, JP-A-62-948, JP-A-63-234244, JP-A-63-234245, and JP-A-63-234246. Further, these groups capable of being adsorbed onto the silver halide may be modified into a precursor thereof. Examples of the precursor include those groups described in JP-A-2-285344.

$R_{10}$ or $R_{20}$ of general formula (D) may contain a ballast group or a polymer that is commonly used in an immobile photographic additive, such as a coupler. The ballast group referred to in the present invention denotes a $C_6$ or higher straight-chain or branched-chain alkyl (or alkylene), alkoxy (or alkyleneoxy), alkylamino (or alkyleneamino), or alkylthio group or a group having these groups as a part of their structure, and more preferably a $C_7$ to $C_{24}$ straight-chain or branched-chain alkyl (or alkylene), alkoxy (or alkyleneoxy), alkylamino (or alkyleneamino), alkylthio group or groups having the above groups as a part of their structure. The polymer referred to above includes, for example, those described in JP-A-1-100530.

$R_{10}$ or $R_{20}$ of formula (D) may contain a plurality of hydrazino groups as a substituent. Here, the compound represented by formula (D) is a multimer of the hydrazino group. Specific examples of the compound include those described, for example, in JP-A-64-86134, JP-A-4-16938, JP-A-5-197091, WO 95-32452, WO 95-32453, JP-A-9-179229, JP-A-9-235264, JP-A-9-235265, JP-A-9-235266, and JP-A-9-235267.

$R_{10}$ or $R_{20}$ of formula (D) may contain a cationic group (specifically, a group having a quaternary ammonio group, a group having a quaternary phosphorus atom, a nitrogen-containing heterocyclic group having a quaternary nitrogen atom, etc.), a group having an ethyleneoxy or propyleneoxy repeating unit, an alkyl, aryl or heterocyclic thio group, a dissociable group (denoting a group or a partial structure having a proton with low acidity that can dissociate in an alkaline developing solution or, further, a salt thereof; more specifically, for example, a carboxy group/—COOH, a sulfo group/—$SO_3H$, a phosphonic acid group/—$PO_3H$, a phosphoric acid group/—$OPO_3H$, a hydroxy group/—OH, a mercapto group/—SH, an —$SO_2NH_2$ group, an N-substituted sulfonamide group/an —$SO_2NH$— group, a —$CONHSO_2$— group, a —$CONHSO_2NH$— group, an —$NHCONHSO_2$— group, an —$SO_2NHSO_2$— group, a —CONHCO— group, an active methylene group, an —NH— group present in a nitrogen-containing heterocyclic group, salts of the above groups, etc.) Examples of the compound containing the above-mentioned group include compounds described in JP-A-7-234471, JP-A-5-333466, JP-A-6-19032, JP-A-6-19031 and JP-A-5-45761, U.S. Pat. Nos. 4,994,365 and 4,988,604, JP-A-7-259240, JP-A-7-5610 and JP-A-7-244348, German Patent No. 4006032, and JP-A-11-7093.

In formula (D), $A_{10}$ and $A_{20}$ each represent a hydrogen atom or an alkyl or arylsulfonyl group having 20 or less carbon atoms (preferably, a phenylsulfonyl group, or a phenylsulfonyl group substituted with a substituent(s) so that the total of the Hammett substituent constant(s) of the substituent(s) becomes −0.5 or more), or an acyl group having 20 or less carbon atoms (preferably, a benzoyl group, or a benzoyl group substituted with a substituent(s) so that the total of the Hammett substituent constant(s) of the substituent(s) becomes −0.5 or more, or a straight-chain, branched, or cyclic, substituted or unsubstituted, aliphatic acyl group, wherein examples of the substituent include a halogen atom, an ether group, a sulfonamide group, a carbonamide group, a hydroxyl group, a carboxyl group, and a sulfo group). $A_{10}$ and $A_{20}$ each are most preferably a hydrogen atom.

A particularly preferable hydrazine derivative used in the present invention is now explained.

$R_{20}$ is particularly preferably a substituted phenyl group, and the substituent is particularly preferably a sulfonamido group, an acylamino group, an ureido group, a carbamoyl group, a thioureido group, an isothioureido group, a sulfamoylamino group, an N-acylsulfamoylamino group, etc., yet more preferably a sulfonamido group or a ureido group, and most preferably a sulfonamido group.

$R_{10}$ and $R_{20}$ in the hydrazine derivative represented by general formula (D) are particularly preferably substituted directly or indirectly with at least one substituent such as a ballast group, a group that is adsorbed on a silver halide, a group containing a quaternary ammonium group, a quaternized nitrogen-containing heterocyclic group, a group containing an ethyleneoxy repeating unit, an alkyl, aryl or heterocyclic thio group, a dissociable group that can dissociate in an alkaline developing solution or a hydrazino group that can form a multimer (a group denoted by —NHNH—$G_{10}$—$R_{10}$). Furthermore, $R_{20}$ is preferably substituted directly or indirectly with at least one of the above-mentioned substituents, and is most preferably a phenyl substituted with a benzenesulfonamido group, the benzene-sulfonamido group being substituted directly or indirectly with any one of the above-mentioned substituent on its benzene ring.

Among the groups represented by $R_{10}$ when $G_{10}$ is a —CO— group, preferred are a hydrogen atom, an alkyl group, an alkenyl group, an alkynyl group, an aryl group, or a heterocyclic group, and more preferably a hydrogen atom, an alkyl group, and a substituted aryl group, wherein the substituent is especially preferably an electron-withdrawing group or an o-hydroxymethyl group. A hydrogen atom and an alkyl group are most preferred.

When $G_{10}$ is a —COCO— group, an alkoxy group, an aryloxy group, and an amino group are preferred. Further, a substituted amino group, specifically an alkylamino group, an arylamino group, and a saturated or unsaturated heterocyclic amino group, are especially preferred.

Further, when $G_{10}$ is an —$SO_2$—group, $R_{10}$ is preferably an alkyl group, an aryl group, or a substituted amino group.

In formula (D), $G_{10}$ is preferably a —CO— group or a —COCO— group and especially preferably a —CO— group.

Next, specific examples of the compound represented by formula (D) are illustrated below, but it is not intended to restrict the scope of the invention to them.

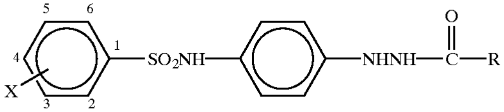
| | X = | R = —H | R = —$C_2F_4$—COOH (or —$C_2F_4$—$COO^{\ominus}K^{\oplus}$) | R = 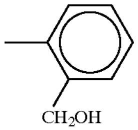 | R = 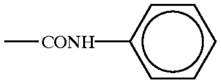 |
|---|---|---|---|---|---|
| D-1 | 3-$NHCOC_9H_{19}$(n) | 1a | 1b | 1c | 1d |
| D-2 | 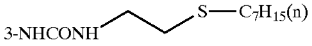 | 2a | 2b | 2c | 2d |
| D-3 | 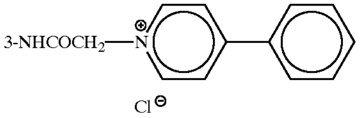 | 3a | 3b | 3c | 3d |
| D-4 | 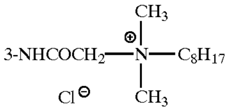 | 4a | 4b | 4c | 4d |
| D-5 | 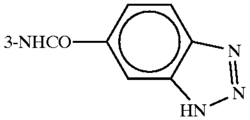 | 5a | 5b | 5c | 5d |
| D-6 | 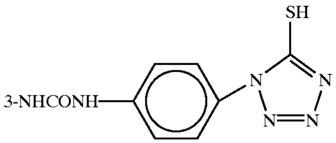 | 6a | 6b | 6c | 6d |
| D-7 | 2,4-$(CH_3)_2$-3-$SC_2H_4$—$(OC_2H_4)_4$—$OC_8H_{17}$ | 7a | 7b | 7c | 7d |

-continued
| X = | | R = | | | |
|---|---|---|---|---|---|
| | | —H | —$CF_2H$ | 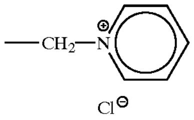 | 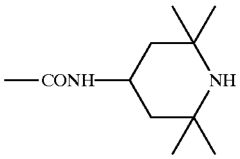 |
| D-8 | 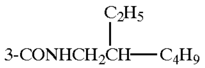 | 8a | 8e | 8f | 8g |
| D-9 | 6-$OCH_3$-3-$C_5H_{11}$(t) | 9a | 9e | 9f | 9g |
| D-10 | 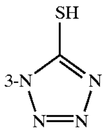 | 10a | 10e | 10f | 10g |
| D-11 | 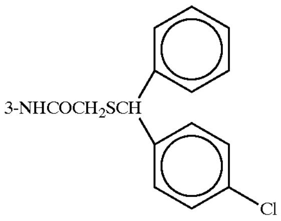 | 11a | 11e | 11f | 11g |
| D-12 | 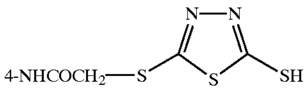 | 12a | 12e | 12f | 12g |
| D-13 | 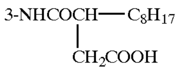 | 13a | 13e | 13f | 13g |
| D-14 | 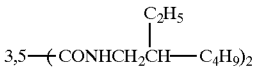 | 14a | 14e | 14f | 14g |

-continued
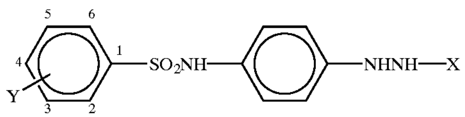
| | Y = | X = —CHO | —$COCF_3$ | —$SO_2CH_3$ | —P(=O)$(OC_2H_5)_2$ |
|---|---|---|---|---|---|
| D-15 | 3-NHCOCH$_2$ 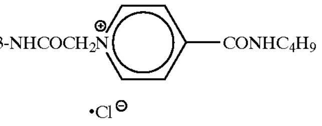 | 15a | 15h | 15i | 15j |
| D-16 | 4-NHCO$(CH_2)_2$ 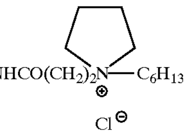 | 16a | 16h | 16i | 16j |
| D-17 | 3-$SO_2NH$ 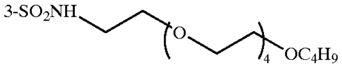 | 17a | 17h | 17i | 17j |
| D-18 | 3,4-$(COOCH(CH_3)COOC_4H_9)_2$ | 18a | 18h | 18i | 18j |
| D-19 | 3-NHCO 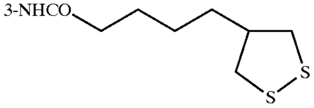 | 19a | 19h | 19i | 19j |
| D-20 | 3-$NHSO_2NH$—$C_8H_{17}$ | 20a | 20h | 20i | 20j |
| D-21 | 2-Cl-5- 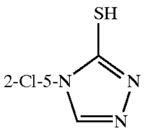 | 21a | 21h | 21i | 21j |

-continued
| | | R = | | | |
|---|---|---|---|---|---|
| | | —H | —$CF_2H$ | 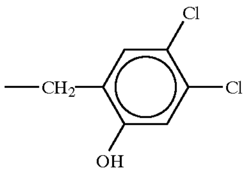 | —$CONHC_3H_7$ |
| D-22 | 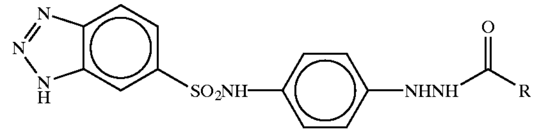 | 22a | 22e | 22k | 22l |
| D-23 | 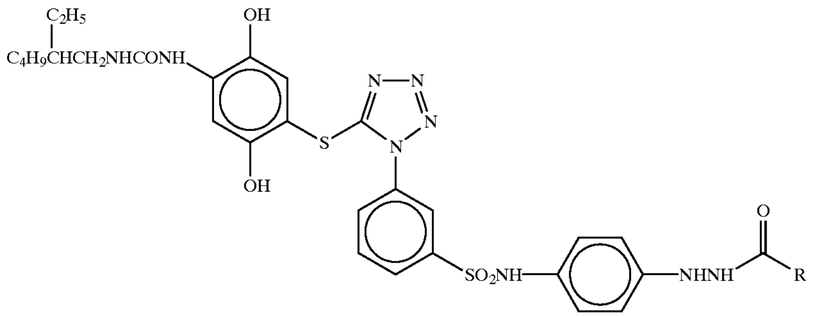 | 23a | 23e | 23k | 23l |
| D-24 | 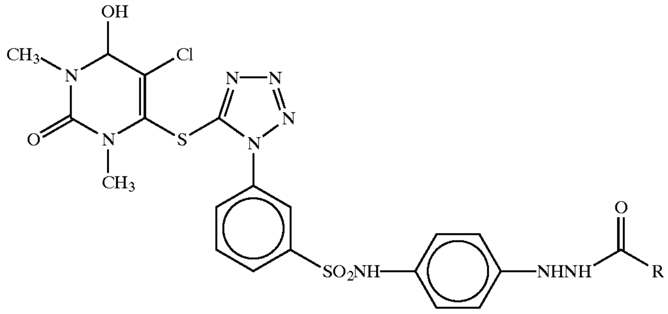 | 24a | 24e | 24k | 24l |

-continued
| | | | | | |
|---|---|---|---|---|---|
| D-25 | 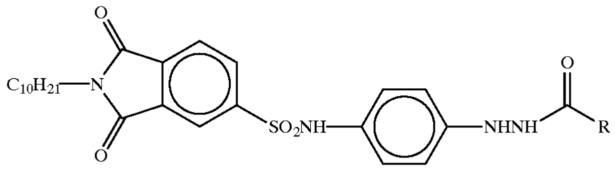 | 25a | 25e | 25k | 25l |
| D-26 | 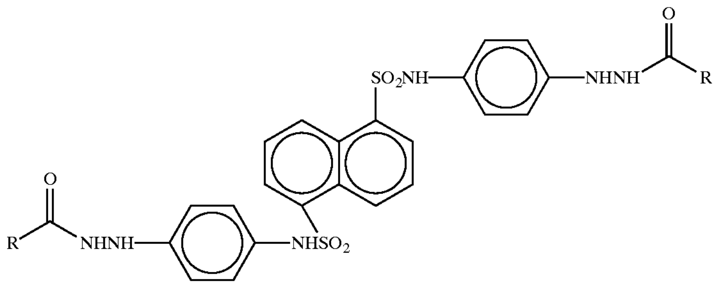 | 26a | 26e | 26k | 26l |
| D-27 | 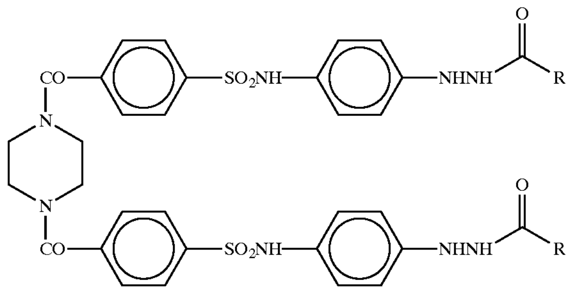 | 27a | 27e | 27k | 27l |
| D-28 | 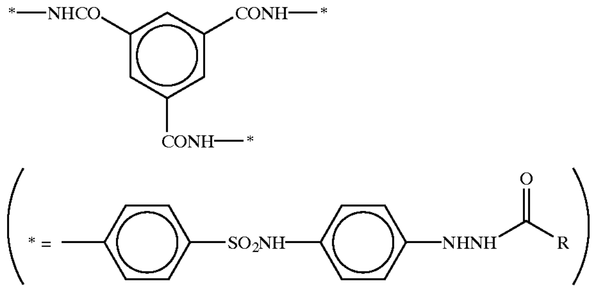 | 28a | 28e | 28k | 28l |

-continued
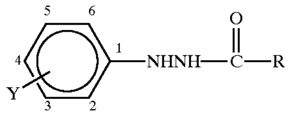
| | Y = | R = —H | —CH$_2$OCH$_3$ | 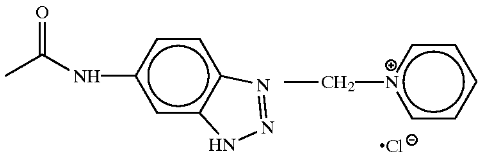 | |
|---|---|---|---|---|---|
| D-29 | 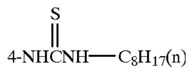 | 29a | 29m | 29n | 29f |
| D-30 | 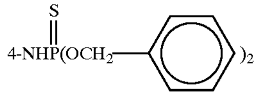 | 30a | 30m | 30n | 30f |
| D-31 | 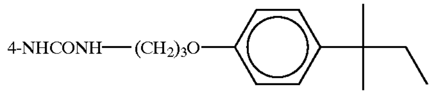 | 31a | 31m | 31n | 31f |
| D-32 | 4-OH<br>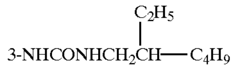 | 32a | 32m | 32n | 32f |
| D-33 | 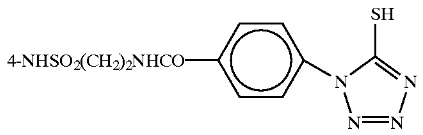 | 33a | 33m | 33n | 33f |
| D-34 | 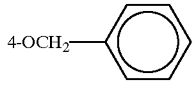 | 34a | 34m | 34n | 34f |

-continued
| | | | | | |
|---|---|---|---|---|---|
| D-35 | 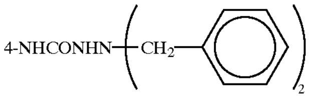 | 35a | 35m | 35n | 35f |
| | | R = | | | |
|---|---|---|---|---|---|
| | Y = | —H | $—C_3F_6—COOH$ | $—CONHCH_3$ | 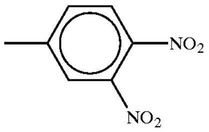 |
| D-36 | $2-NHSO_2CH_3—$<br>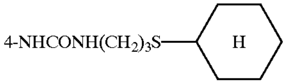 | 36a | 36o | 36p | 36q |
| D-37 | $2-OCH_3—$<br>$4-NHSO_2C_{12}H_{25}$ | 37a | 37o | 37p | 37q |
| D-38 | $3-NHCOC_{11}H_{23}—$<br>$4-NHSO_2CF_3$ | 38a | 38o | 38p | 38q |
| D-39 | 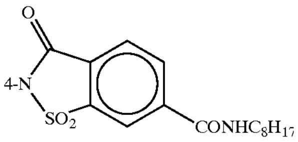 | 39a | 39o | 39p | 39q |
| D-40 | $4-OCO(CH_2)_2COOC_6H_{13}$ | 40a | 40o | 40p | 40q |
| D-41 | 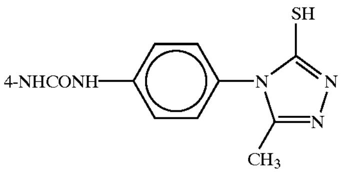 | 41a | 41o | 41p | 41q |

-continued
D-42 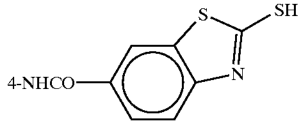 42a 42o 42p 42q
No.
D-43
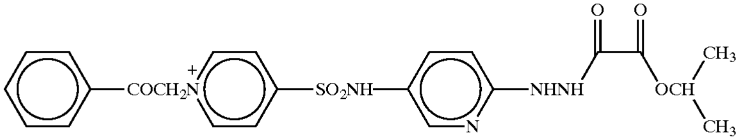
D-44
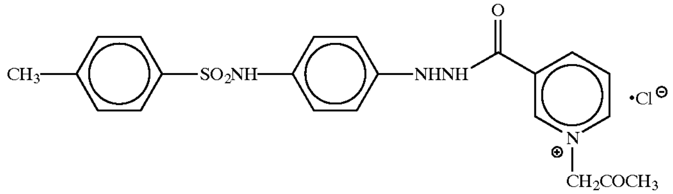
D-45
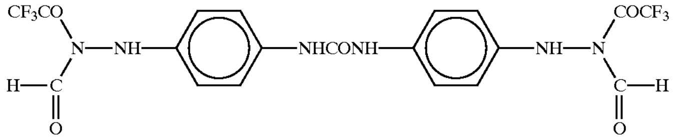
D-46
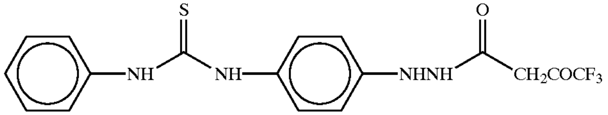
D-47
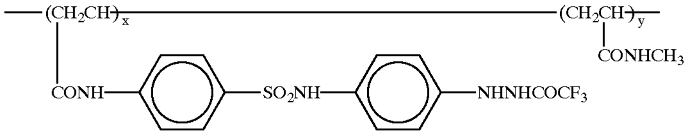
x:y = 3:97 平均分子量≒10万

-continued
D-48
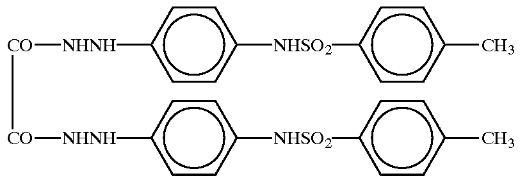
D-49
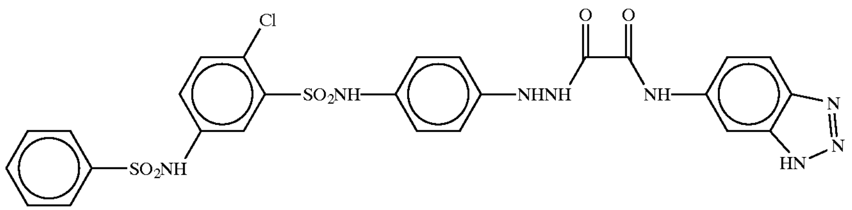
D-50
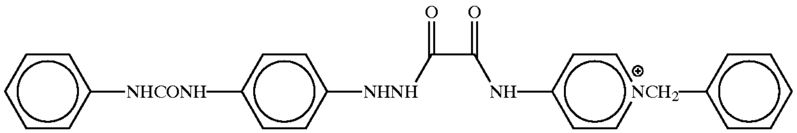
D-51
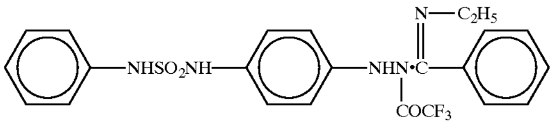
D-52
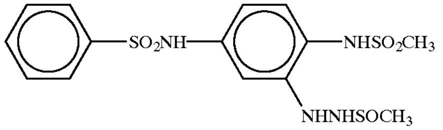
D-53
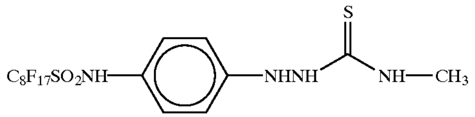

-continued
D-54
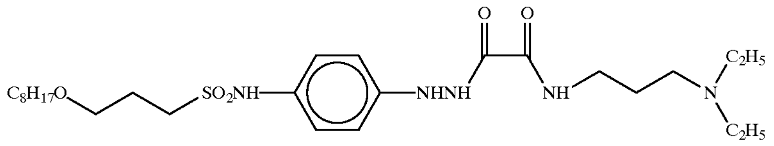
D-55
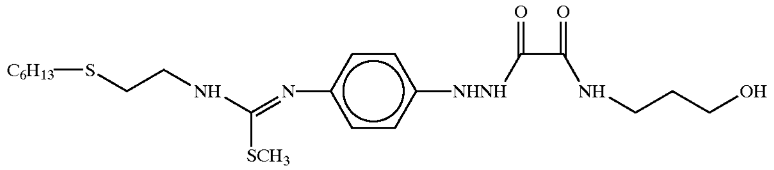
D-56
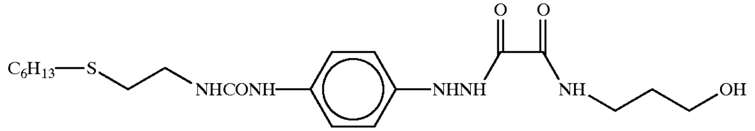
D-57
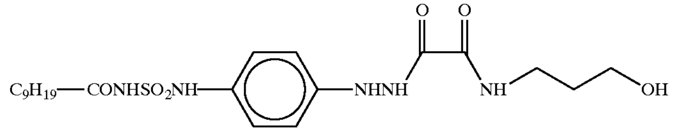
D-58
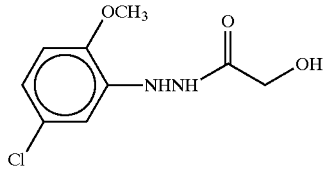
D-59
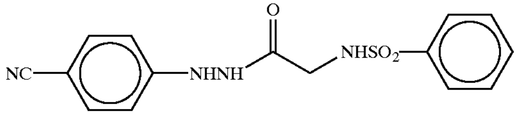

-continued
D-60
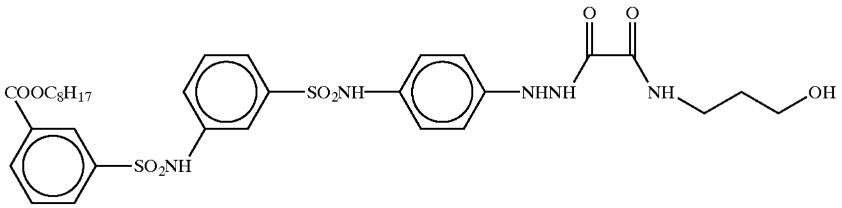
D-61
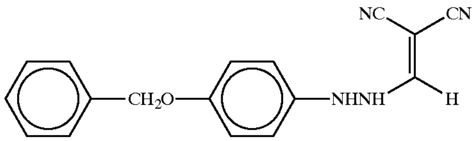
D-62
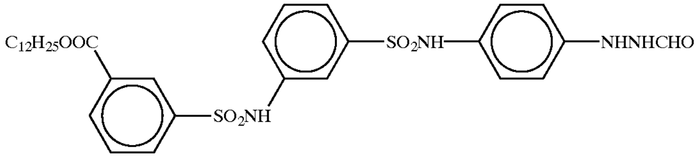
D-63
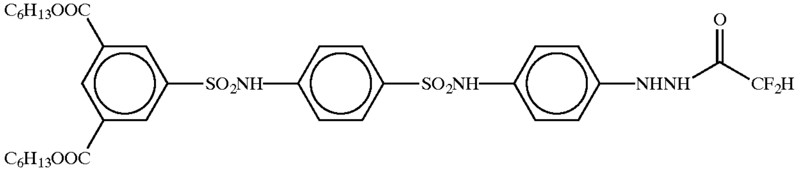
D-64
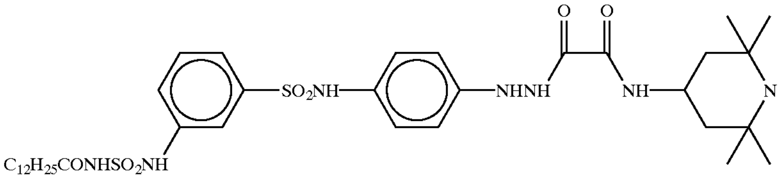

-continued
D-65
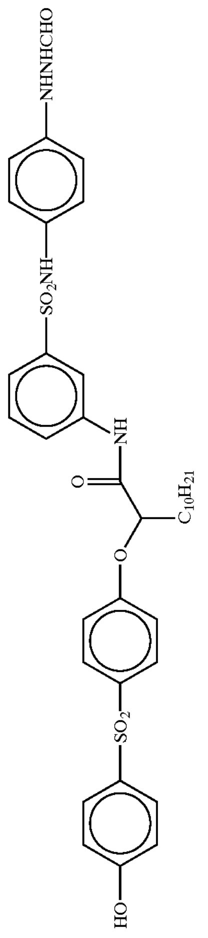
D-66
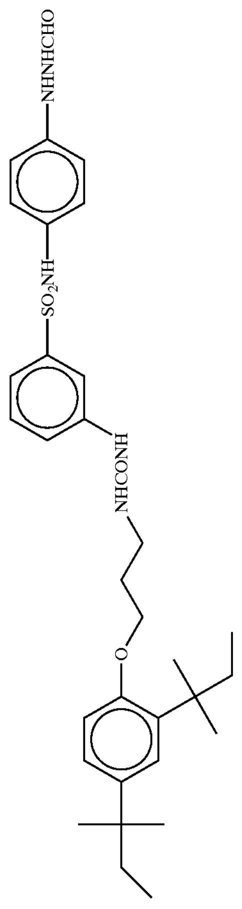
D-67
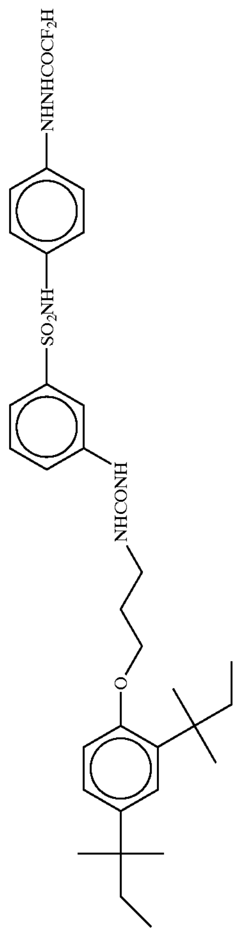

As the hydrazine derivatives for use in the present invention, in addition to the above, the following hydrazine derivatives can also preferably be used. The hydrazine derivatives for use in the present invention can be synthesized by various methods described in the following patents:

Compounds represented by (Chemical formula 1) described in JP-B-6-77138; specifically, compounds described on pages 3 and 4 of the specification; compounds represented by formula (I) described in JP-B-6-93082; specifically, Compounds 1 to 38 described on pages 8 to 18 of the specification; compounds represented by formulae (4), (5), and (6) described in JP-A-6-230497; specifically, Compound 4-1 to Compound 4-10 described on pages 25 and 26, Compound 5-1 to Compound 5-42 described on pages 28 to 36, and Compound 6-1 to Compound 6-7 described on pages 39 and 40 of the specification, respectively; compounds represented by formulae (1) and (2) described in JP-A-6-289520; specifically, Compounds 1-1) to 1-17) and 2-1) described on pages 5 to 7 of the specification; compounds represented by (Chemical formula 2) and (Chemical formula 3) described in JP-A-6-313936; specifically, compounds described on pages 6 to 19 of the specification; compounds represented by (Chemical formula 1) described in JP-A-6-313951; specifically, compounds described on pages 3 to 5 of the specification; compounds represented by formula (I) described in JP-A-7-5610; specifically, Compounds I-1 to I-38 described on pages 5 to 10 of the specification; compounds represented by formula (II) described in JP-A-7-77783; specifically, Compounds II-1 to II-102 described on pages 10 to 27 of the specification; compounds represented by formulae (H) and (Ha) described in JP-A-7-104426; specifically, Compounds H-1 to H-44 described on pages 8 to 15 of the specification; compounds that have an anionic group in the vicinity of the hydrazine group or a nonionic group for forming an intramolecular hydrogen bond with the hydrogen atom of the hydrazine; and especially, compounds represented by formulae (A), (B), (C), (D), (E), and (F), described in Japanese Patent Application No. 9-22082; more specifically, Compounds N-1 to N-30 described in the specification thereof; and compounds represented by formula (1) described in Japanese patent application No. 9-22082; specifically, Compounds D-1 to D-55 described in the specification thereof. Furthermore, there are hydrazine derivatives described in WO 95-32452, WO 95-32453, JP-A-9-179229, JP-A-9-235264, JP-A-9-235265, JP-A-9-235266, JP-A-9-235267, JP-A-9-319019, JP-A-9-319020, JP-A-10-130275, JP-A-11-7093, JP-A-6-332096, JP-A-7-209789, JP-A-8-6193, JP-A-8-248549, JP-A-8-248550, JP-A-8-262609, JP-A-8-314044, JP-A-8-328184, JP-A-9-80667, JP-A-9-127632, JP-A-9-146208, JP-A-9-160156, JP-A-10-161260, JP-A-10-221800, JP-A-10-213871, JP-A-10-254082, JP-A-10-254088, JP-A-7-120864, JP-A-7-244348, JP-A-7-333773, JP-A-8-36232, JP-A-8-36233, JP-A-8-36234, JP-A-8-36235, JP-A-8-272022, JP-A-9-22083, JP-A-9-22084, JP-A-9-54381, and JP-A-10-175946.

The hydrazine-series nucleating agent for use in the present invention may be dissolved before use in an appropriate water-miscible organic solvent, such as an alcohol (e.g. methanol, ethanol, propanol, a fluorinated alcohol), a ketone (e.g. acetone, methyl ethyl ketone), dimethylformamide, dimethylsulfoxide, or methyl cellosolve.

The hydrazine-series nucleating agent for use in the present invention may also be used as emulsion dispersion obtained by dissolving the compound according to an already well-known emulsion dispersion method using an oil, such as dibutyl phthalate, tricresyl phosphate, glyceryl triacetate, or diethyl phthalate; or using an auxiliary solvent, such as ethyl acetate or cyclohexanone, and mechanically processing it into an emulsion dispersion. Alternatively, the hydrazine derivative powder may be used by dispersing it in water using a ball mill, a colloid mill, or ultrasonic waves, according to a method known as a solid dispersion method.

The hydrazine nucleating agent for use in the present invention may be added to any of a silver halide emulsion layer and other hydrophilic colloid layers on the silver halide emulsion layer side of a support, but it is preferably added to the above-described silver halide emulsion layer or to a hydrophilic colloid layer adjacent thereto. It is also possible to use two or more types of hydrazine nucleating agent in combination.

The amount added of the nucleating agent for use in the present invention is preferably from $1\times10^{-5}$ to $1\times10^{-2}$ mol, more preferably from $1\times10^{-5}$ to $5\times10^{-3}$ mol, and most preferably from $2\times10^{-5}$ to $5\times10^{-3}$ mol, per mol of silver halide.

It is preferable for the light-sensitive material of the present invention to contain as a nucleation accelerator an amine derivative, an onium salt, a disulfide derivative, or a hydroxymethyl derivative. As examples of the nucleation accelerators used in the present invention there can be cited: compounds described on page 48, lines 2 to 37 of JP-A-7-77783; and more specifically, Compounds A-1) to A-73) described on pages 49 to 58; compounds represented by (Chemical formula 21), (Chemical formula 22), and (Chemical formula 23) described in JP-A-7-84331; specifically, compounds described on pages 6 to 8 of the specification; compounds represented by formulae [Na] and [Nb] described in JP-A-7-104426; specifically, Compounds Na-1 to Na-22 and Compounds Nb-1 to Nb-12 described on pages 16 to 20 of the specification; compounds represented by general formulae (1), (2), (3), (4), (5), (6) and (7) described in JP-A-8-272023 and, more specifically, Compounds 1-1 to 1-19, Compounds 2-1 to 2-22, Compounds 3-1 to 3-36, Compounds 4-1 to 4-5, Compounds 5-1 to 5-41, Compounds 6-1 to 6-58 and Compounds 7-1 to 7-38 described in the above specification; and nucleation accelerators described on page 55, column 108, line 8 to page 69, column 136, line 44 of JP-A-9-297377.

Specific examples of the nucleation accelerator for use in the present invention are illustrated below, but it is not intended to restrict the scope of the invention to them.

A-1)

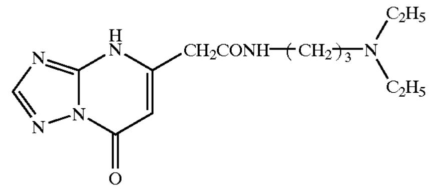

A-2)

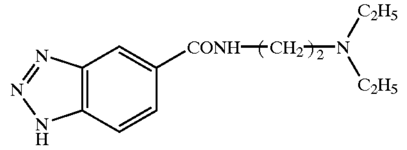

A-3)

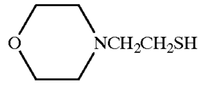

-continued

A-4)

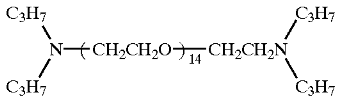

A-5)

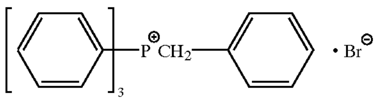

A-6)

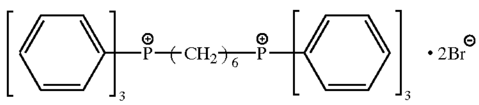

A-7)

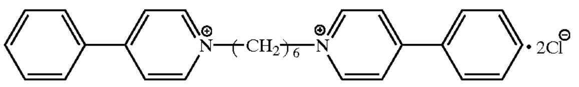

A-8)

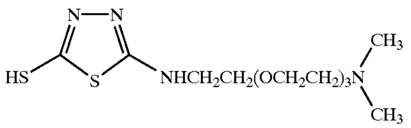

A-9)

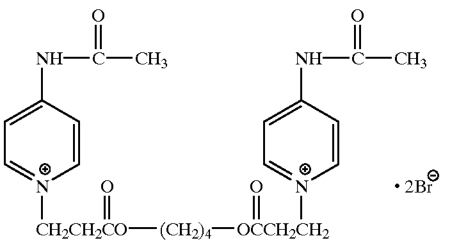

A-10)

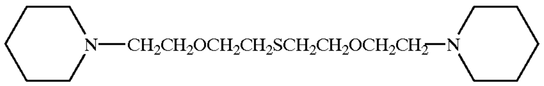

A-11)

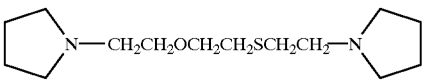

A-12)

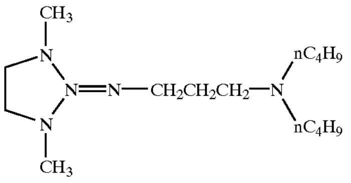

A-13)

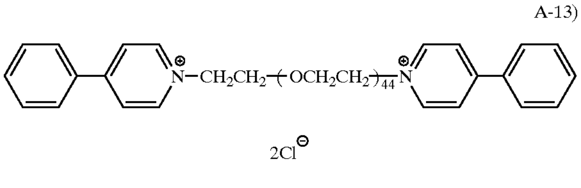

The nucleation accelerator for use in the present invention may be dissolved in an appropriate water-miscible organic solvent before use, and examples of the solvent include an alcohol (e.g. methanol, ethanol, propanol, a fluorinated alcohol), a ketone (e.g. acetone, methyl ethyl ketone), dimethylformamide, dimethylsulfoxide, or methyl cellosolve.

The nucleation accelerator may be used as an emulsion dispersion obtained by dissolving the compound according to an already well-known emulsion dispersion method, using an oil, such as dibutyl phthalate, tricresyl phosphate, glyceryl triacetate, or diethyl phthalate, or using an auxiliary solvent, such as ethyl acetate or cyclohexanone, and mechanically processing it into an emulsion dispersion. Alternatively, the nucleation accelerator powder may be used by dispersing it in water using a ball mill, a colloid mill, or ultrasonic waves according to a method known as a solid dispersion method.

The nucleation accelerator for use in the present invention may be added to any of a silver halide emulsion layer and other hydrophilic colloid layers on the silver halide emulsion layer side of the support, but it is preferably added to the silver halide emulsion layer or a hydrophilic colloid layer adjacent thereto.

The nucleation accelerator for use in the present invention is preferably added in an amount of from $1\times10^{-6}$ to $2\times10^{-2}$ mol, more preferably from $1\times10^{-5}$ to $2\times10^{-2}$ mol, and most preferably from $2\times10^{-5}$ to $1\times10^{-2}$ mol, per mol of silver halide. It is also possible to use two or more types of nucleation accelerator in combination.

Various additives can be used in the light-sensitive material of the present invention and are not particularly restricted, and, for example, those described in the following passages may be preferably used:

polyhydroxybenzene compounds described in JP-A-3-39948, from page 10, lower right column, line 11, to page 12, lower left column, line 5, and more specifically, Compounds (III)-1 to (III)-25 described in the above specification;

compounds described in JP-A-1-118832 represented by formula (I) and having substantially no absorption maximum in the visible region, and more specifically, Compounds I-1 to I-26 described in the above specification;

antifogging agents described in JP-A-2-103536, page 17, lower right column, line 19, to page 18, upper right column, line 4;

polymer latexes described on page 18, lower left, line 12 to line 20 of JP-A-2-103536; polymer latexes described in JP-A-9-179228 having an active methylene group represented by general formula (I); more specifically, Compounds I-1 to I-16 described in the above specification; polymer latexes having a core-shell structure described in JP-A-9-179228; more specifically, Compounds P-1 to P-55 described in the above specification; acidic polymer latexes described on page 14, left column, line 1 to right column, line 30 of JP-A-7-104413; more specifically, Compounds II-1) to II-9) described on page 15 of the above specification;

matting agents, slip agents, and plasticizers described in JP-A-2-103536, page 19, from upper left column, line 15, to upper right column, line 15;

hardening agents described in JP-A-2-103536, page 18, upper right column, lines 5 to 17;

compounds having an acid group described in JP-A-2-103536, from page 18, lower right column, line 6, to page 19, upper left column, line 1;

electrically conductive materials described in JP-A-2-18542, from page 2, lower left column, line 13, to page 3, upper right column, line 7; specifically, metal oxides described in the above specification, page 2, lower right column, lines 2 to 10, and the electrically conductive high-molecular compounds of Compounds P-1 to P-7 described in the above specification;

water-soluble dyes described in JP-A-2-103536, page 17, lower left column, line 1 to lower right, line 18;

solid disperse dyes described in JP-A-9-179243 represented by general formulae (FA), (FA1), (FA2) and (FA3); more specifically, Compounds F1 to F34 described in the above specification, Compounds (II-2) to (II-24) described in JP-A-7-152112, Compounds (III-5) to (III-18) described in JP-A-7-152112; Compounds (IV-2) to (IV-7) in JP-A-7-152112; solid disperse dyes described in JP-A-2-294638 and JP-A-5-11382;

surfactants described in JP-A-2-12236, from page 9, upper right column, line 7 to page 9, lower right column, line 3; PEG-series surfactants described in JP-A-2-103536, page 18, lower left column, lines 4 to 7; fluorinated surfactants described in JP-A-3-39948, from page 12, lower left column, line 6, to page 13, lower right column, line 5 and, more specifically, Compounds IV-1 to VI-15 described in the specification;

redox compounds described in JP-A-5-274816 capable of releasing a development inhibitor when oxidized, preferably redox compounds represented by formulae (R-1), (R-2), and (R-3) described in the specification and, more specifically, Compounds R-1 to R-68 described in the specification; and binders described on page 3, lower right, line 1 to line 20 of JP-A-2-18542.

The processing agents, such as the developing solution and a fixing solution, and the processing method for use in the present invention are described below, but it is not intended to restrict the scope of the invention thereto.

The development process used in the present invention may be performed by any known method, and a known developing solution may be used.

A developing agent used in the developing solution (hereinafter, a developer starter solution and a developer replenisher are together called a developing solution) used in the present invention is not particularly limited, but it preferably contains a dihydroxybenzene, an ascorbic acid derivative or a hydroquinone monosulfonate, which may be used singly or in combination. It is particularly preferable to use a dihyroxy benzene series developing agent and an auxiliary developing agent that shows superadditivity therewith. A combination of a dihydroxybenzene or an ascorbic acid derivative with a 1-phenyl-3-pyrazolidone, a combination of a dihydroxybenzene or an ascorbic acid derivative with a p-aminophenol, etc. can be cited.

With regard to the developing agent used in the present invention, hydroquinone, chlorohydroquinone, isopropylhydroquinone, methylhydroquinone, etc. can be cited as the dihydroxybenzene developing agent, and hydroquinone is particularly preferred. With regard to the ascorbic acid derivative developing agent, there are ascorbic acid, isoascorbic acid and salts thereof, and sodium erythorbate is particularly preferred in terms of material cost.

With regard to 1-phenyl-3-pyrazolidone developing agents and derivatives thereof used in the present invention, there are 1-phenyl-3-pyrazolidone, 1-phenyl-4,4-dimethyl-3-pyrazolidone, 1-phenyl-4-methyl-4-hydroxymethyl-3-pyrazolidone, etc.

With regard to the p-aminophenol system developing agents used in the present invention, there are N-methyl-p-aminophenol, p-aminophenol, N-(β-hydroxyphenyl)-p-aminophenol, N-(4-hydroxyphenyl)glycine, o-methoxy-p-(N,N-dimethylamino)phenol, o-methoxy-p-(N-methylamino)phenol, etc. and, in particular, N-methyl-p-aminophenol and aminophenols described-in JP-A-9-297377 and JP-A-9-297378 are preferred.

The dihydroxybenzene-series developing agent is preferably used in an amount of generally from 0.05 to 0.8 mol/L. When a dihydroxybenzene compound and a 1-phenyl-3-pyrazolidone compound or a p-aminophenol compound are used in combination, the former is preferably used in an amount of from 0.05 to 0.6 mol/L, and more preferably from 0.10 to 0.5 mol/L, and the latter is preferably used in an amount of 0.06 mol/L or less, and more preferably from 0.003 to 0.03 mol/L.

The ascorbic acid derivative developing agent is preferably used in an amount of 0.01 to 0.5 mol/L, and more preferably 0.05 to 0.3 mol/L. When using an ascorbic acid derivative and a 1-phenyl-3-pyrazolidone or a p-aminophenol in combination, it is preferable to use 0.01 to 0.5 mol/L of the ascorbic acid derivative and 0.005 to 0.2 mol/L of the 1-phenyl-3-pyrazolidone or p-aminophenol.

The developing solution used in processing the light-sensitive material of the present invention may contain an additive (e.g. a developing agent, an alkali agent, a pH buffer, a preservative, a chelating agent) that is commonly used. Specific examples thereof are described below, but the present invention is by no means limited thereto.

Examples of the buffer for use in the developing solution used in processing the light-sensitive material of the present invention include carbonates, boric acids described in JP-A-62-186259, saccharides (e.g. saccharose) described in JP-A-60-93433, oximes (e.g. acetoxime), phenols (e.g. 5-sulfosalicylic acid), and tertiary phosphates (e.g. sodium salt and potassium salt), with carbonates and boric acids being preferred. The buffer, particularly the carbonate, is preferably used in an amount of 0.05 mol/L or more, particularly preferably from 0.08 to 1.0 mol/L.

In the present invention, both the developer starter solution and the developer replenisher preferably have the property that, when 0.1 mol of sodium hydroxide is added to 1 L thereof, the increase in pH is no greater than 0.5. With regard to a method for confirming that the developer starter solution or the developer replenisher that is used has the above-mentioned property, the pH of the developer starter solution or the developer replenisher that is to be tested is adjusted to 10.5, 0.1 mol of sodium hydroxide is added to 1 L of the liquid, the pH of the mixture is measured, and it is determined that the solution or the replenisher has the above-mentioned property if the increase in pH is no greater than 0.5. In the present invention, it is particularly preferable to use a developer starter solution or a developer replenisher that shows an increase in pH of no greater than 0.4 in the above-mentioned test.

Examples of the preservative for use in the present invention include sodium sulfite, potassium sulfite, lithium sulfite, ammonium sulfite, sodium bisulfite, potassium metabisulfite, and formaldehyde-sodium bisulfite. The sulfite is used in an amount of preferably 0.2 mol/L or more, and particularly preferably 0.3 mol/L or more, but if too much is added, silver staining in the developing solution is caused. Accordingly, the upper limit is preferably 1.2 mol/L. The amount is particularly preferably from 0.35 to 0.7 mol/L.

As a preservative for the dihyroxy benzene series developing agent, a small amount of the above-mentioned ascorbic acid derivative can be used in combination with the sulfite. It is preferable to use sodium erythorbate in terms of material cost. The amount added is preferably in the range of 0.03 to 0.12 as a molar ratio relative to the dihyroxy benzene series developing agent, and particularly preferably in the range of 0.05 to 0.10. When an ascorbic acid derivative is used as the preservative, the developing solution preferably does not contain a boron compound.

Examples of additives that can be used other than those described above include a development inhibitor, such as sodium bromide or potassium bromide; an organic solvent, such as ethylene glycol, diethylene glycol, triethylene glycol, or dimethylformamide; a development accelerator, such as an alkanolamine like diethanolamine or triethanolamine, or an imidazole or a derivative thereof; and a physical development unevenness inhibitor, such as a heterocyclic mercapto compound (e.g. sodium 3-(5-mercaptotetrazol-1-yl)benzene sulfonate, 1-phenyl-5-mercaptotetrazole) or the compounds described in JP-A-62-212651.

Further, a mercapto-series compound, an indazole-series compound, a benzotriazole-series compound, or a benzimidazole-series compound may be added as an antifoggant or a black spot (black pepper) inhibitor. Specific examples thereof include 5-nitroindazole, 5-p-nitrobenzoylaminoindazole, 1-methyl-5-nitroindazole, 6-nitroindazole, 3-methyl-5-nitroindazole, 5-nitrobenzimidazole, 2-isopropyl-5-nitrobenzimidazole, 5-nitrobenzotriazole, sodium 4-((2-mercapto-1,3,4-thiadiazol-2-yl)thio)butanesulfonate, 5-amino-1,3,4-thiadiazole-2-thiol, methylbenzotriazole, 5-methyl benzotriazole, and 2-mercaptobenzotriazole. The amount thereof added is generally from 0.01 to 10 mmol, preferably from 0.1 to 2 mmol, per L of the developing solution.

Further, various kinds of organic or inorganic chelating agents can be used individually or in combination in the developing solution for use in the present invention.

Examples of the inorganic chelating agent include sodium tetrapolyphosphate and sodium hexametaphosphate.

Examples of the organic chelating agent mainly include an organic carboxylic acid, an aminopolycarboxylic acid, an organic phosphonic acid, an aminophosphonic acid, and an organic phosphonocarboxylic acid.

Examples of the organic carboxylic acid include acrylic acid, oxalic acid, malonic acid, succinic acid, glutaric acid, gluconic acid, adipic acid, pimelic acid, azelaic acid, sebacic acid, nonanedicarboxylic acid, decanedicarboxylic acid, undecanedicarboxylic acid, maleic acid, itaconic acid, malic acid, citric acid, and tartaric acid.

Examples of the aminopolycarboxylic acid include iminodiacetic acid, nitrilotriacetic acid, nitrilotripropionic acid, ethylenediaminemonohydroxyethyltriacetic acid, ethylenediaminetetraacetic acid, glycolethertetraacetic acid, 1,2-diaminopropanetetraacetic acid, diethylenetriaminepentaacetic acid, triethylenetetraminehexaacetic acid, 1,3-diamino-2-propanoltetraacetic acid, glycoletherdiaminetetraacetic acid, and compounds described in JP-A-52-25632, JP-A-55-67747, JP-A-57-102624 and JP-B-53-40900.

Examples of the organic phosphonic acid include hydroxyalkylidene-diphosphonic acids, described in U.S. Pat. Nos. 3,214,454 and 3,794,591 and West German Patent Publication (OLS) No. 2,227,369, and the compounds described in Research Disclosure, Vol. 181, Item 18170 (May 1979).

Examples of the aminophosphonic acid include amino-tris(methylenephosphonic acid), ethylenediamine tetramethylenephosphonic acid, aminotrimethylenephosphonic acid, and the compounds described in Research Disclosure, No. 18170 (supra), JP-A-57-208554, JP-A-54-61125, JP-A-55-29883, and JP-A-56-97347.

Examples of the organic phosphonocarboxylic acid include the compounds described in JP-A-52-102726, JP-A-53-42730, JP-A-54-121127, JP-A-55-4024, JP-A-55-4025, JP-A-55-126241, JP-A-55-65955, JP-A-55-65956, and Research Disclosure, No. 18170 (supra).

The organic and/or inorganic chelating agents are not limited to those described above. The organic and/or inorganic chelating agents may be used in the form of an alkali metal salt or an ammonium salt. The amount of the chelating agent added is preferably from $1\times10^{-4}$ to $1\times10^{-1}$ mol, and more preferably from $1\times10^{-3}$ to $1\times10^{-2}$ mol, per L of the developing solution.

Examples of a silver stain inhibitor added to the developing solution include the compounds described in JP-A-56-24347, JP-B-56-46585, JP-B-62-2849, JP-A-4-362942, and JP-A-8-6215; triazines having one or more mercapto groups (for example, the compounds described in JP-B-6-23830, JP-A-3-282457, and JP-A-7-175178); pyrimidines having one or more mercapto groups (e.g. 2-mercaptopyrimidine, 2,6-dimercaptopyrimidine, 2,4-dimercaptopyrimidine, 5,6-diamino-2,4-dimercaptopyrimidine, 2,4,6-trimercaptopyrimidine, compounds described in JP-A-9-274289); pyridines having one or more mercapto groups (e.g. 2-mercaptopyridine, 2,6-dimercaptopyridine, 3,5-dimercaptopyridine, 2,4,6-trimercaptopyridine, compounds described in JP-A-7-248587); pyrazines having one or more mercapto groups (e.g. 2-mercaptopyrazine, 2,6-dimercaptopyrazine, 2,3-dimercaptopyrazine, 2,3,5-trimercaptopyrazine); pyridazines having one or more mercapto groups (e.g. 3-mercaptopyridazine, 3,4-dimercaptopyridazine, 3,5-dimercaptopyridazine, 3,4,6-trimercaptopyridazine); the compounds described in JP-A-7-175177, and polyoxyalkylphosphates described in U.S. Pat. No. 5,457,011. These silver stain inhibitors may be used individually or in a combination of two or more. The amount thereof added is preferably from 0.05 to 10 mmol, and more preferably from 0.1 to 5 mmol, per L of the developing solution.

The developing solution may contain a compound described in JP-A-61-267759, as a dissolution aid.

Further, the developing solution may contain a color toner, a surfactant, an antifoaming agent, or a hardening agent, if necessary.

The pH of the developing solution is preferably in the range of 9.0 to 12.0, particularly preferably 9.0 to 11.0, and yet more preferably 9.5 to 11.0. The alkali agent used for adjusting the pH may be a usual water-soluble inorganic alkali metal salt (e.g. sodium hydroxide, potassium hydroxide, sodium carbonate, potassium carbonate).

With respect to cations of the developing solution, potassium ions do not inhibit development compared with sodium ions and the indentations on the periphery of the blackened portion, called a fringe, are smaller. When the developing solution is stored as a concentrated solution, a potassium salt is generally preferred because of its higher solubility. However, since, in the fixing solution, the potassium ions cause fixing inhibition at the same level as is caused by silver ions, if the developing solution has a high potassium ion concentration the developing solution is carried over by the light-sensitive material to disadvantageously increase the potassium ion concentration in the fixing solution. Accordingly, the molar ratio of potassium ion to sodium ion in the developing solution is preferably between 20:80 and 80:20. The ratio of potassium ion to sodium ion can be freely controlled within the above-described range by a counter cation such as a pH buffer, a pH-adjusting agent, a preservative, or a chelating agent.

In the continuous development processing of the present invention, the amount of the developing solution that is replenished is generally 200 ml or less, preferably from 30 to 200 ml, more preferably from 50 to 180 ml, and most preferably 30 to 180 ml, per $m^2$ of the light-sensitive material. The developer replenisher may have the same composition and/or concentration as the developer starter solution, or it may have a different composition and/or concentration from the starter solution.

Examples of a fixing agent in a fixing solution for use in the present invention include ammonium thiosulfate, sodium thiosulfate, and ammonium sodium thiosulfate. The amount of the fixing agent used may be varied appropriately, but it is generally from about 0.7 to about 3.0 mol/L.

The fixing solution for use in the present invention may contain a water-soluble aluminum salt or a water-soluble chromium salt, which acts as a hardening agent, and of these salts, a water-soluble aluminum salt is preferred. Examples thereof include aluminum chloride, aluminum sulfate, potassium alum, ammonium aluminum sulfate, aluminum nitrate, and aluminum lactate. These are each preferably contained, in terms of an aluminum ion concentration in the solution used, in an amount of from 0.01 to 0.15 mol/L.

When the fixing solution is stored as a concentrated solution or a solid agent, it may be constituted by a plurality of parts, preparing the hardening agent or the like as a separate part, or it may be constituted as a one-part agent containing all components.

The fixing solution can contain, as desired, a preservative (for example, a sulfite, a bisulfite, a metabisulfite, etc. at 0.015 mol/L or more, and preferably 0.02 to 0.3 mol/L), a pH buffer solution (for example, acetic acid, sodium acetate, sodium carbonate, sodium hydrogen carbonate, phosphoric acid, succinic acid, adipic acid, etc. at 0.1 to 1 mol/L, and preferably 0.2 to 0.7 mol/L), and a compound having an ability to stabilize aluminum or an ability to soften hard water (for example, gluconic acid, iminodiacetic acid, 5-sulfosalicylic acid, glucoheptanic acid, malic acid, tartaric acid, citric acid, oxalic acid, maleic acid, glycolic acid, benzoic acid, salicylic acid, Tiron, ascorbic acid, glutaric acid, aspartic acid, glycine, cysteine, ethylenediamine tetraacetic acid, nitrilotriacetic acid, derivatives thereof, salts thereof, saccharides, etc. at 0.001 mol/L to 0.5 mol/L, and more preferably 0.005 mol/L to 0.3 mol/L), and in terms of recent concerns related to protection of the environment it is preferable for the fixing solution not to contain a boron system compound.

In addition, the fixing solution may contain a compound described in JP-A-62-78551, a pH-adjusting agent (e.g. sodium hydroxide, ammonia, sulfuric acid), a surfactant, a wetting agent, or a fixing accelerator. Examples of the surfactant include anionic surfactants, such as sulfated products and sulfonated products; polyethylene-series surfactants, and amphoteric surfactants described in JP-A-57-6840. A known antifoaming agent may also be used. Examples of the wetting agent include alkanolamines and alkylene glycols. Examples of the fixing accelerator include alkyl- or aryl-substituted thiosulfonic acids and salts thereof described in JP-A-6-308681; thiourea derivatives described in JP-B-45-35754, JP-B-58-122535, and JP-B-58-122536; alcohols having a triple bond within the molecule; thioether compounds described in U.S. Pat. No. 4,126,459; mercapto compounds described in JP-A-64-4739, JP-A-1-4739, JP-A-1-159645, and JP-A-3-101728; and thiocyanates and mesoionic compounds described in JP-A-4-170539.

The fixing solution for use in the present invention preferably has a pH of 4.0 or above, and more preferably from 4.5 to 6.0. The pH of the fixing solution increases due to mingling of the developing solution upon processing and, in this case, a hardening fixing solution has a pH of 6.0 or less, and preferably 5.7 or below, and a non-hardening fixing solution has a pH of 7.0 or below, and preferably 6.7 or below.

The amount of the fixing solution replenished is 500 ml or less, preferably 390 ml or less, and more preferably from 80 to 320 ml, per $m^2$ of the light-sensitive material. The replenisher may have the same composition and/or concentration as the starter solution, or it may have a composition and/or a concentration different from the starter solution.

The fixing solution may be regenerated and reused using a known fixing solution regenerating method, such as electrolytic silver recovery. An example of the regenerator includes model FS-2000 manufactured by Fuji Photo Film, Co., Ltd.

It is also preferred to remove dyes or the like by the use of an adsorption filter, such as activated carbon.

When the developing and fixing solutions used in the present invention are in liquid form, they are preferably stored using a packaging material having a low oxygen permeability as described in, for example, JP-A-61-73147. When these liquids are in the form of a concentrated liquid, 1 part of the concentrated liquid is diluted with 0.2 to 3 parts of water so as to achieve a predetermined concentration before use.

Use of a developer and a fixer in solid form in the present invention can give the same results as those with the solutions. The solid processing agents are described below.

The solid agents used in the present invention can be in any known form (powder, grain, granule, lump, tablet, compactor, briquette, tabular, rod, paste, etc.). These solid agents can be coated with a water-soluble coating agent or film in order to separate components that react with each other on contact, or may have a multi-layer structure so as to separate components that react with each other, or the two methods can be employed in combination.

With regard to a coating agent and a granulation aid, a known material can be used, but it is preferable to use polyvinylpyrrolidone, polyethylene glycol, polystyrenesulfonic acid or a vinyl series compound. In addition, that described in column 2, line 48 to column 3, line 13 of JP-A-5-45805 can be referred to.

In the case of a multi-layer structure, components that do not react with each other on contact may be sandwiched between components that react with each other, and they are then formed into tablets, briquettes, etc. Alternatively, components in a known form may be formed into a similar layer structure and then packaged. These methods are described in JP-A-61-259921, JP-A-4-16841, JP-A-4-78848, JP-A-5-93991, etc.

The bulk density of the solid processing agents is preferably 0.5 to 6.0 g/$cm^3$, and particularly preferably 1.0 to 5.0 g/$cm^3$ for tablets and 0.5 to 1.5 g/$cm^3$ for granules.

With regard to a method for producing the solid processing agents used in the present invention, any known method can be employed. For example, JP-A-61-259921, JP-A-4-15641, JP-A-4-16841, JP-A-4-32837, JP-A-4-78848, JP-A-5-93991, JP-A-4-85533, JP-A-4-85534, JP-A-4-85535, JP-A-5-134362, JP-A-5-197070, JP-A-5-204098, JP-A-5-224361, JP-A-6-138604, JP-A-6-138605, JP-A-8-286329, etc. can be referred to.

More specifically, a rolling granulation method, an extrusion granulation method, a compression granulation method, a crushing granulation method, a stirring granulation method, a spray drying method, a dissolution-solidification method, a briquetting method, a roller compacting method, etc. can be employed.

The solubility of the solid agents used in the present invention can be controlled by varying the surface state (smoothness, porosity, etc.) or the partial thickness or by making a hollow doughnut form. Furthermore, it is possible to introduce different solubilities to a plurality of granulated materials or employ a plurality of forms so as to adjust the degree of solubility of materials having different solubilities. Moreover, multi-layered granules having different compositions for their surface and interior may be used.

The solid agents are preferably packaged using a material having low oxygen and moisture permeability, and the packaging material can be in any known form such as a bag, a tube, or a box. It is also preferable to make a foldable form as disclosed in JP-A-6-242585 to JP-A-6-242588, JP-A-6-247432, JP-A-6-247448, JP-A-6-301189, JP-A-7-5664 and JP-A-7-5666 to JP-A-7-5669 in terms of saving storage space for waste packaging materials. These packaging materials may have a screw cap, a pull top or an aluminum seal in an outlet through which the processing agent is taken out, and the packaging materials may be heat-sealed; it is also possible to employ other known materials, and they are not particularly limited. The waste packaging materials are preferably recycled or reused from the viewpoint of environmental protection.

The method for dissolving and replenishing the solid processing agents of the present invention is not particularly limited, and a known method can be employed. Examples of such a method include a method involving dissolving a predetermined amount of a solid processing agent using a dissolution device having a stirring function and replenishing it, a method involving dissolving a solid processing agent in a dissolution device having a dissolution section and a stock section for a finished solution as described in JP-A-9-80718 and replenishing the solution from the stock section, a method for dissolution and replenishment involving charging a processing agent into a circulation system of an automatic processor as described in JP-A-5-119454, JP-A-6-19102 and JP-A-7-261357, a method involving charging a processing agent into an automatic processor with a built-in dissolution bath as the processing of a light-sensitive material progresses so as to dissolve the agent, and any other known methods can be used. The charging of the processing agent can be carried out manually or using a dissolution device having an unsealing mechanism as described in JP-A-9-138495 or an automatic processor for automatic unsealing and automatic charging, and the use of the latter devices is preferred in terms of the working environment. More specifically, there are methods in which the inlet is pierced, peeled off, cut out or pushed in, methods described in JP-A-6-19102 and JP-A-6-95331, etc.

The light-sensitive material processed through development and fixing is then subjected to water-washing or stabilization (hereinafter, unless otherwise specified, water-washing includes stabilization, and the solution for use therein is called water or washing water). The water for use in water-washing may be tap water, ion exchanged water, distilled water, or a stabilizing solution. The amount of the washing water replenished is generally from about 8 to about 17 L per $m^2$ of the light-sensitive material, but an amount lower than the above-described range may also be used. In particular, when the amount replenished is 3 L or less (including 0, namely, standing water washing), not only can the processing achieve water savings, it can also dispense with piping for installation of an automatic developing machine. When water-washing is performed with a small amount of water replenished, a rinsing tank of a squeeze roller or a crossover roller, described in JP-A-63-18350 and JP-A-62-287252, is preferably provided. Alternatively, addition of various oxidizing agents (e.g. ozone, hydrogen peroxide, sodium hypochlorite, an active halogen, chlorine dioxide, sodium carbonate hydrogen peroxide salt) or filtration may be combined, so as to reduce the pollution load, which is a problem incurred in the case of water-washing with a small amount of water, or for preventing water scale.

As the method for reducing the amount of washing water replenished, a multi-stage countercurrent system (for example, two or three stages) has been known for a long time, and the amount of washing water replenished is preferably from 50 to 200 ml per $m^2$ of the light-sensitive material. This effect can also be obtained similarly in the case of an independent multi-stage system (a method not using a countercurrent system but supplying a new solution individually to the multi-stage water-washing tanks).

In the method in the present invention, a means for preventing water scale may be provided in the water-washing step. The water-scale-preventing means is not particularly restricted, and a known means may be used. Examples thereof include a method of adding a fungicide (a so-called water scale inhibitor), a method of passing electricity, a method of irradiating with ultraviolet rays, infrared rays, or far infrared rays; a method of applying a magnetic field, a method of treating with ultrasonic waves, a method of applying heat, and a method of emptying the tank on standing. The water-scale-preventing means may be applied according to the processing of the light-sensitive material; it may be applied at a predetermined interval irrespective of the state of use, or it may be applied only during a non-processing period, such as nighttime. Further, the washing water may be pretreated with a water-scale-preventing means and then replenished. Further, in view of preventing the generation of resistant microbes, it is preferred to employ different water-scale-preventing means at predetermined intervals.

It is possible to employ a combination of a water-saving water-scale-preventing machine model AC-1000 manufactured by Fuji Photo Film, Co., Ltd. and a water-scale-preventing agent AB-5 manufactured by Fuji Photo Film, Co., Ltd., and a method described in JP-A-11-231485 can be used.

The fungicide is not particularly restricted, and a known fungicide may be used. Examples thereof include, in addition to the above-described oxidizing agents, glutaraldehyde; a chelating agent, such as aminopolycarboxylic acid; a cationic surfactant; and a mercaptopyridine oxide (e.g. 2-mercaptopyridine-N-oxide), and a sole fungicide may be used, or a plurality of fungicides may be used in combination.

The electricity may be passed according to the method described in JP-A-3-224685, JP-A-3-224687, JP-A-4-16280, or JP-A-4-18980.

In addition, a known water-soluble surfactant or anti-foaming agent may be added, so as to prevent uneven processing due to bubbling, or to prevent stain transfer. Further, a dye adsorbent described in JP-A-63-163456 may be provided in the water-washing system, so as to prevent stains due to a dye dissolved out from the light-sensitive material.

The overflow solution from the water-washing step may be partly or wholly used by mixing it with a processing solution having fixing ability, as described in JP-A-60-235133. It is also preferred, from the viewpoint of conservation of the natural environment, to reduce the biochemical oxygen demand (BOD), chemical oxygen demand (COD), or iodine consumption before discharge, by subjecting the solution to a microorganism treatment (for example, sulfur oxidizing bacteria or activated sludge treatment, or treatment with a filter having a porous carrier, such as activated carbon or a ceramic carrying microorganisms thereon) or oxidation treatment with an oxidizing agent or electrification, or to reduce the silver concentration in waste water by passing the solution through a filter, using a polymer having affinity for silver, or by adding a compound that forms a hardly soluble silver complex, such as trimercaptotriazine, to precipitate silver, and then passing the solution through a filter.

In some cases, stabilization may be performed subsequent to the water-washing, and as one example, a bath containing a compound described in JP-A-2-201357, JP-A-2-132435, JP-A-1-102553, and JP-A-46-44446 may be used as a final bath for the light-sensitive material. This stabilization bath may also contain, if desired, an ammonium compound, a metal compound, such as Bi or Al, a fluorescent whitening agent, various chelating agents, a film pH-adjusting agent, a hardening agent, a bactericide, a fungicide, an alkanolamine, or a surfactant.

The additives, such as the fungicide and the stabilizing agent added to the water-washing or stabilization bath, may be formed into a solid agent, similarly to the above-described developing and fixing processing agents.

Wastewater of the developing solution, the fixing solution, the washing water, or the stabilizing solution for use in the present invention, is preferably burned for disposal. The wastewater can also be formed into a concentrated solution or a solid by a concentrating apparatus, as described, for example, in JP-B-7-83867 and U.S. Pat. No. 5,439,560, and then disposed of.

When the amount of the processing agent replenished is reduced, it is preferred to prevent evaporation or air oxidation of the solution by reducing the contact area of the processing tank with air. A roller transportation-type automatic-developing machine is described, for example, in U.S. Pat. Nos. 3,025,779 and 3,545,971, and in the present specification, it is simply referred to as a roller transportation-type automatic processor. This automatic processor includes four steps of development, fixing, water-washing, and drying, and it is most preferred to follow this four-step processing also in the present invention, though other steps (e.g. a stopping step) are not excluded. Further, a rinsing bath may be provided between development and fixing, and/or between fixing and water-washing.

In the development processing in the present invention, the dry-to-dry time is preferably from 25 to 160 seconds, the development and fixing time is 40 seconds or less, preferably from 6 to 35 seconds, and the temperature of each solution is preferably from 25 to 50° C., and more preferably from 30 to 40° C. The temperature and the time of water-washing are preferably from 0 to 50° C. and 40 seconds or less, respectively. According to the method in the present invention, the light-sensitive material after development, fixing, and water-washing may be passed through squeeze rollers, for squeezing out the washing water, and then dried. The drying is generally performed at a temperature of from about 40° C. to about 100° C. The drying time may be appropriately varied depending upon the ambient conditions. The drying method is not particularly restricted, and any known method may be used, but hot-air drying, and drying by far infrared rays or a heat roller as described in JP-A-4-15534, JP-A-5-2256, and JP-A-5-289294 may be used, and a plurality of drying methods may also be used in combination.

The present invention claims priority 35 USC § 119 to Japanese Patent Application No. 2000-388060, filed on Dec. 21, 2000. The contents of that application are incorporated herein by reference in their entirety.

EXAMPLES

The present invention will be described in more detail with reference to the following examples, but the invention should not be construed as being limited thereto.

Example 1

Preparation of Emulsion A

| | |
|---|---|
| Solution 1 | |
| Water | 750 ml |
| Gelatin | 20 g |
| Sodium chloride | 3 g |
| 1,3-Dimethylimidazolidine-2-thione | 20 mg |
| Sodium benzenethiosulfonate | 10 mg |
| Citric acid | 0.7 g |
| Solution 2 | |
| Water | 300 ml |
| Silver nitrate | 150 g |
| Solution 3 | |
| Water | 300 ml |
| Sodium chloride | 38 g |
| Potassium bromide | 32 g |
| Potassium hexachloroiridate (III) (0.005% in 20% aqueous KCl solution) | 5 ml |
| Ammonium hexachlororhodate (0.001% in 20% aqueous NaCl solution) | 7 ml |

The potassium hexachloroiridate (III) (0.005% in 20% aqueous KCl solution) and ammonium hexachlororhodate (0.001% in 20% aqueous NaCl solution) used in Solution 3 were prepared by dissolving powders thereof in a 20% aqueous solution of KCl and a 20% aqueous solution of NaCl respectively and heating the solutions at 40° C. for 120 minutes.

90% of each of Solution 2 and Solution 3 were simultaneously added over 20 minutes while stirring to Solution 1 that was maintained at 38° C. with a pH of 4.5 so as to form grain nuclei having a size of 0.16 $\mu$m. Subsequently, Solution 4 and Solution 5 below were added to the above-mentioned mixture over 8 minutes, and the remaining 10% of each of Solution 2 and Solution 3 were further added thereto over 2 minutes, thereby growing the grains to 0.21 $\mu$m. Moreover, 0.15 g of potassium iodide was added thereto and the mixture was ripened for 5 minutes, and the grain formation was thus completed.

| | |
|---|---|
| Solution 4 | |
| Water | 100 ml |
| Silver nitrate | 50 g |
| Solution 5 | |
| Water | 100 ml |
| Sodium chloride | 13 g |
| Potassium bromide | 11 g |
| Potassium ferrocyanide | 5 mg |

Thereafter, the emulsion was washed with water by flocculation according to a standard method. More specifically, the temperature was decreased to 35° C., 3 g of an anionic precipitating agent -1 below was added, and the pH was decreased using sulfuric acid until the silver halide precipitated (the pH was in the range of 3.2±0.2). About 3 L of the supernatant was then removed (first water washing). A further 3 L of distilled water was added to the mixture, and sulfuric acid was added until silver halide precipitated. 3 L of the supernatant was again removed (second water washing). The operational procedure of the second water washing was repeated once more (third water washing), and water-washing and desalting steps were thus completed. After the water-washing and desalting, 45 g of gelatin was added to the emulsion so as to adjust the pH and the pAg to 5.6 and 7.5 respectively. Thereto, 10 mg of sodium benzenethiosulfonate, 3 mg of sodium benzenethiosulfinate, 15 mg of sodium thiosulfate, and 10 mg of chloroauric acid were added, and the mixture was thus subjected to chemical sensitization to give it an optimal sensitivity at 55° C. Then, 100 mg of 1,3,3a,7-tetrazaindene as a stabilizing agent, and 100 mg of Proxel (trade name, manufactured by ICI Co., Ltd.) as an antiseptic were added.

Finally, a silver iodochlorobromide cubic grain emulsion containing 70 mol % of silver chloride and 0.08 mol % of silver iodide and having an average grain size of 0.22 μm and a coefficient of variation of 9% was obtained (the final emulsion had a pH of 5.7, a pAg of 7.5, an electrical conductivity of 40 μS/m, a density of $1.2\times10^{-3}$ kg/$m^3$, and a viscosity of 50 mPa.s).

Anionic precipitating agent −1

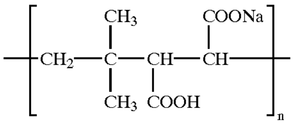

Average molecular weight 120,000

Preparation of Emulsion B

| Solution 1 | |
|---|---|
| Water | 750 ml |
| Gelatin | 20 g |
| Sodium chloride | 1 g |
| 1,3-Dimethylimidazolidine-2-thione | 20 mg |
| Sodium benzenethiosulfonate | 10 mg |
| Citric acid | 0.7 g |
| Solution 2 | |
| Water | 300 ml |
| Silver nitrate | 150 g |
| Solution 3 | |
| Water | 300 ml |
| Sodium chloride | 38 g |
| Potassium bromide | 32 g |
| Potassium hexachloroiridate (III) (0.005% in 20% aqueous KCl solution) | 5 ml |
| Ammonium hexachlororhodate (0.001% in 20% aqueous NaCl solution) | 15 ml |

The potassium hexachloroiridate (III) (0.005% in 20% aqueous KCl solution) and ammonium hexachlororhodate (0.001% in 20% aqueous NaCl solution) used in Solution 3 were prepared by dissolving powders thereof in a 20% aqueous solution of KCl and a 20% aqueous solution of NaCl respectively and heating the solutions at 40° C. for 120 minutes.

90% of each of Solution 2 and Solution 3 were simultaneously added over 20 minutes while stirring to Solution 1 that was maintained at 38° C. with a pH of 4.5 so as to form grain nuclei having a size of 0.16 μm. Subsequently, 500 mg of 1,3,3a,7-tetrazaindene was added to the above-mentioned mixture, Solution 4 and Solution 5 below were then added to the above-mentioned mixture over 8 minutes, and the remaining 10% of each of Solution 2 and Solution 3 were further added thereto over 2 minutes, thereby growing the grains to 0.18 μm. Moreover, 0.15 g of potassium iodide was added thereto and the mixture was ripened for 5 minutes, and the grain formation was thus completed.

| Solution 4 | |
|---|---|
| Water | 100 ml |
| Silver nitrate | 50 g |
| Solution 5 | |
| Water | 100 ml |
| Sodium chloride | 13 g |
| Potassium bromide | 11 g |
| Potassium ferrocyanide | 2 mg |

Thereafter, the emulsion was washed with water by flocculation according to a standard method. More specifically, the temperature was decreased to 35° C., 3 g of the anionic precipitating agent −1 was added, and the pH was decreased using sulfuric acid until the silver halide precipitated (the pH was in the range of 3.2±0.2). About 3 L of the supernatant was then removed (first water washing). A further 3 L of distilled water was added to the mixture, and sulfuric acid was added until silver halide precipitated. 3 L of the supernatant was again removed (second water washing). The operational procedure of the second water washing was repeated once more (third water washing), and water-washing and desalting steps were thus completed. After the water-washing and desalting, 45 g of gelatin was added to the emulsion so as to adjust the pH and the pAg to 5.6 and 7.5 respectively. Thereto, 10 mg of sodium benzenethiosulfonate, 3 mg of sodium benzenethiosulfinate, 2 mg of triphenylphosphine selenide, and 1 mg of chloroauric acid were added, and the mixture was thus subjected to chemical sensitization to give it an optimal sensitivity at 55° C. Then, 100 mg of 1,3,3a,7-tetrazaindene as a stabilizing agent, and 100 mg of Proxel as an antiseptic were added.

Finally, a silver iodochlorobromide cubic grain emulsion containing 70 mol % of silver chloride and 0.08 mol % of silver iodide and having an average particle size of 0.18 μm and a coefficient of variation of 10% was obtained (the final emulsion had a pH of 5.7, a pAg of 7.5, an electrical conductivity of 40 μS/m, a density of $1.2\times10^{-3}$ kg/$m^3$, and a viscosity of 50 mPa.s).

Formulation of Light-insensitive Silver Halide Grains

| Solution 1 | |
|---|---|
| Water | 1 L |
| Gelatin | 20 g |
| Sodium chloride | 3.0 g |

-continued

| | |
|---|---|
| 1,3-Dimethylimidazolidine-2-thione | 20 mg |
| Sodium benzenethiosulfonate | 8 mg |
| Solution 2 | |
| Water | 400 ml |
| Silver nitrate | 100 g |
| Solution 3 | |
| Water | 400 ml |
| Sodium chloride | 13.5 g |
| Potassium bromide | 45.0 g |
| Potassium hexachloroiridate (III) (0.001% aqueous solution) | 860 ml |

Solution 1, Solution 2 and Solution 3 that were maintained at 70° C. with a pH of 4.5 were simultaneously added together over 15 minutes while stirring so as to form grain nuclei. Subsequently, Solution 4 and Solution 5 above were added to the above-mentioned mixture over 15 minutes. Moreover, 0.15 g of potassium iodide was added thereto, and the grain formation was thus completed.

Thereafter, the emulsion was washed with water by flocculation according to a standard method. More specifically, the temperature was decreased to 35° C., 3 g of the anionic precipitating agent −1 was added, and the pH was decreased using sulfuric acid until the silver halide precipitated (the pH was in the range of 3.2±0.2). About 3 L of the supernatant was then removed (first water washing). A further 3 L of distilled water was added to the mixture, and sulfuric acid was added until silver halide precipitated. 3 L of the supernatant was again removed (second water washing). The operational procedure of the second water washing was repeated once more (third water washing), and water-washing and desalting steps were thus completed. After the water-washing and desalting, 45 g of gelatin was added to the emulsion so as to adjust the pH and the pAg to 5.7 and 7.5 respectively. As an antiseptic, phenoxyethanol was added and Dispersion 1 of a non post-ripened silver iodochlorobromide cubic grain emulsion containing on average 30 mol % of silver chloride and 0.08 mol % of silver iodide and having an average grain size of 0.45 μm and a coefficient of variation of 10% was obtained (the final emulsion had a pH of 5.7, a pAg of 7.5, an electrical conductivity of 40 μS/m, a density of $1.3\times10^{-3}$ kg/m$^3$, and a viscosity of 50 mPa.s).

Preparation of Coated Sample

A sample was prepared by coating the materials on a polyethylene terephthalate film support, which will be described below, having on both its surfaces a moisture-resistant undercoat layer containing vinylidene chloride so as to give a layer structure comprising UL layer/emulsion layer/lower protective layer/upper protective layer.

The methods of preparation, amounts coated and coating methods for each of the layers are explained below.

Emulsion Layer

Emulsion A and Emulsion B were mixed at a ratio of 1:2, and $5.7\times10^{-4}$ mol/mol Ag of a sensitizing dye (SD-1) was added to the mixture so as to carry out spectral sensitization. Furthermore, $3.4\times10^{-4}$ mol/mol Ag of KBr, $2.0\times10^{-4}$ mol/mol Ag of Compound (Cpd-1), $2.0\times10^{-4}$ mol/mol Ag of Compound (Cpd-2) and $8.0\times10^{-4}$ mol/mol Ag of Compound (Cpd-3) were added to the above-mentioned mixture and mixed well. Subsequently, $1.2\times10^{-4}$ mol/mol Ag of 1,3,3a,7-tetrazaindene, $1.2\times10^{-2}$ mol/mol Ag of hydroquinone, $3.0\times10^{-4}$ mol/mol Ag of citric acid, $1.5\times10^{-4}$ mol/mol Ag of hydrazine-type nucleating agent (Cpd-4), $6.0\times10^{-4}$ mol/mol Ag of nucleation-accelerator (Cpd-5), 90 mg/m$^2$ of sodium 2,4-dichloro-6-hydroxy-1,3,5-triazine, 15 wt % relative to the gelatin of colloidal silica having a particle size of 10 μm, 100 mg/m$^2$ of aqueous latex (aqL-6), 150 mg/m$^2$ of a polyethylacrylate latex, 150 mg/m$^2$ of a latex copolymer of methyl acrylate, sodium 2-acrylamido-2-methylpropanesulfonate, and 2-acetoxyethyl methacrylate (ratios by weight 88:5:7), 150 mg/m$^2$ of a core-shell type latex (core: styrene/butadiene copolymer (ratio by weight 37/63), shell: styrene/2-acetoxyethyl acrylate (ratio by weight 84/16), core/shell ratio=50/50), and 4 wt % relative to the gelatin of compound (Cpd-7) were added to the mixture, and the pH of the coating solution so obtained was adjusted to 5.6 using citric acid. The emulsion layer coating solution thus prepared was coated on the support below so that the amount of Ag was 3.4 g/m$^2$ and the amount of gelatin was 1.5 g/m$^2$.

| | |
|---|---|
| Upper protective layer | |
| Gelatin | 0.3 g/m$^2$ |
| Amorphous silica matting agent of av. 3.5 μm | 25 mg/m$^2$ |
| Compound (Cpd-8) (gelatin dispersion) | 20 mg/m$^2$ |
| Colloidal silica having a particle size of 10 to 20 μm (Snowtex C, manufactured by Nissan Chemical Industries, Ltd.) | 30 mg/m$^2$ |
| Compound (Cpd-9) | 50 mg/m$^2$ |
| Sodium dodecylbenzenesulfonate | 20 mg/m$^2$ |
| Compound (Cpd-10) | 20 mg/m$^2$ |
| Compound (Cpd-11) | 20 mg/m$^2$ |
| Antiseptic (Proxel, manufactured by ICI Co., Ltd.) | 1 mg/m$^2$ |
| Lower protective layer | |
| Gelatin | 0.5 g/m$^2$ |
| Light-insensitive silver halide grains | 0.105 g/m$^2$ |
| Compound (Cpd-12) | 15 mg/m$^2$ |
| 1,5-Dihydroxy-2-benzaldoxime | 10 mg/m$^2$ |
| Polyethyl acrylate latex | 150 mg/m$^2$ |
| Compound (Cpd-13) | 3 mg/m$^2$ |
| Antiseptic (Proxel) | 1.5 mg/m$^2$ |
| UL layer | |
| Gelatin | 0.5 g/m$^2$ |
| Polyethyl acrylate latex | 150 mg/m$^2$ |
| Compound (Cpd-7) | 40 mg/m$^2$ |
| Compound (Cpd-14) | 10 mg/m$^2$ |
| Antiseptic (Proxel) | 1.5 mg/m$^2$ |
| [0176] | |

The viscosity of each of the coating solutions for the respective layers was adjusted by adding a viscosity increasing agent represented by structure (Z) below.

Viscosity increasing agent Z

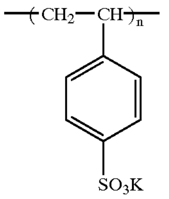

SD-1

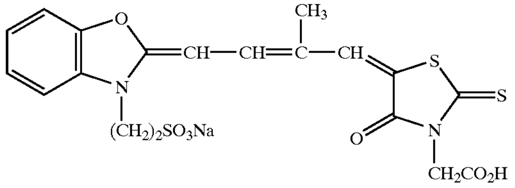

Cpd-1

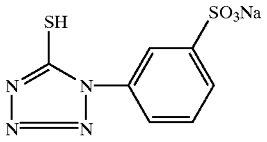

Cpd-2

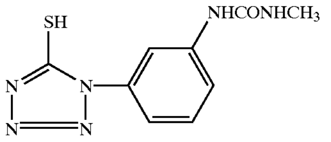

Cpd-3

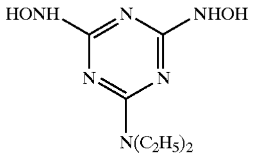

Cpd-4

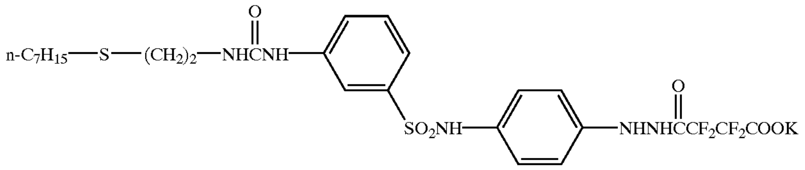

Cpd-5

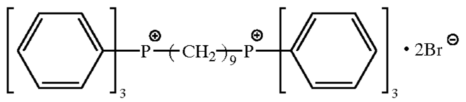

aqL-6

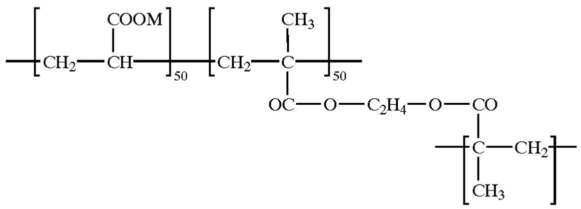

M = H or Na

Cpd-7

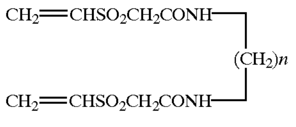

(n = 2):(n = 3) = 3:1

Further, the samples used in the present invention had a back layer and an electrically conductive layer having the following compositions.

| | |
|---|---|
| Back layer | |
| Gelatin | 3.3 g/m$^2$ |
| Compound (Cpd-15) | 40 mg/m$^2$ |
| Compound (Cpd-16) | 20 mg/m$^2$ |
| Compound (Cpd-17) | 90 mg/m$^2$ |
| Compound (Cpd-18) | 40 mg/m$^2$ |
| Compound (Cpd-19) | 26 mg/m$^2$ |
| 1,3-Divinylsulfonyl-2-propanol | 60 mg/m$^2$ |
| Fine grains of polymethyl methacrylate (average grain size 6.5 $\mu$m) | 30 mg/m$^2$ |
| Liquid paraffin | 78 mg/m$^2$ |

-continued

| | |
|---|---|
| Compound (Cpd-7) | 120 mg/m$^2$ |
| Calcium nitrate | 20 mg/m$^2$ |
| Antiseptic (Proxel) | 12 mg/m$^2$ |
| Compound represented by general formula (I) or (II) | Ref. Table 1 |
| Electrically conductive layer | |
| Gelatin | 0.1 g/m$^2$ |
| Sodium dodecyl benzenesulfonate | 20 mg/m$^2$ |
| $SnO_2$/Sb | 200 mg/m$^2$ |
| (9/1 ratio by weight, average grain size 0.25 $\mu$m) | |
| Antiseptic (Proxel) | 0.3 mg/m$^2$ |

Cpd-8

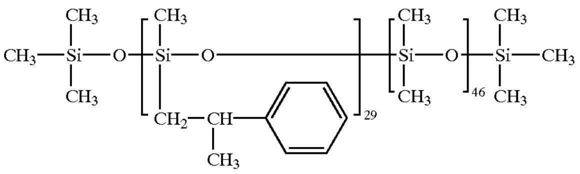

Cpd-9

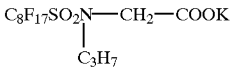

Cpd-10

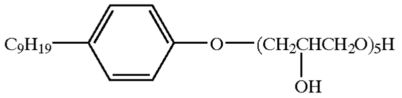

Cpd-11

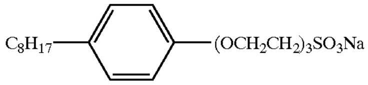

Cpd-12

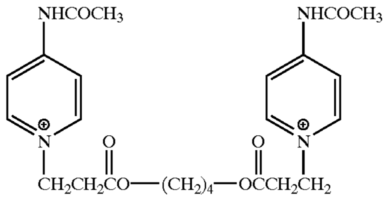

Cpd-13

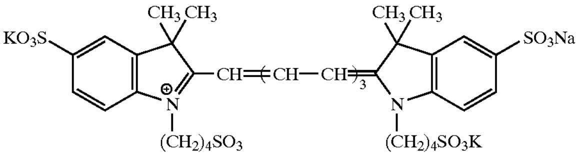

Cpd-14

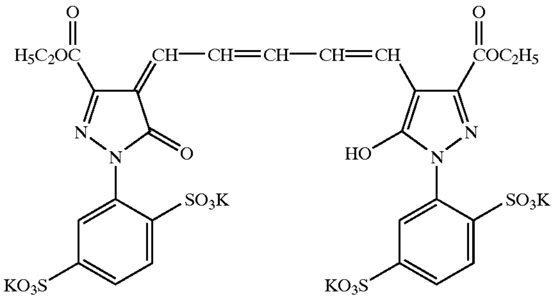

Cpd-15

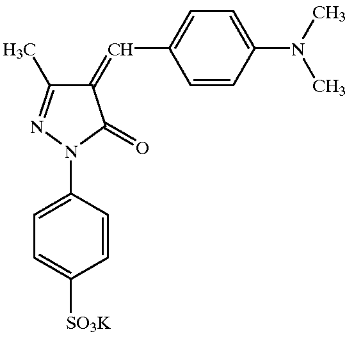

-continued

Cpd-16

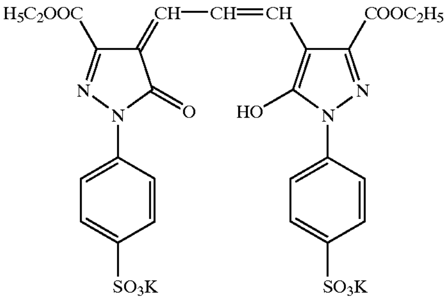

Cpd-17

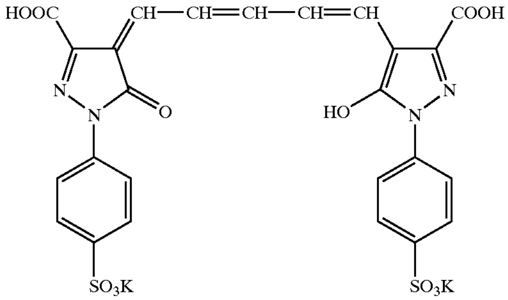

Cpd-18

$CH_3(CH_2)_{11}—CH=CHSO_3Na$

Cpd-19

$CH_3(CH_2)_{11}—CH_2—CHSO_3Na$

Support

First and second undercoat layers having the compositions below were coated in that order on both surfaces of a biaxially stretched polyethylene terephthalate support (thickness 100 μm).

First Undercoat Layer

| | |
|---|---|
| Core-shell type vinylidene chloride copolymer 1 | 15 g |
| 2,4-Dichloro-6-hydroxy-s-triazine | 0.25 g |
| Fine polystyrene particles (average particle size 3 μm) | 0.05 g |
| Compound (Cpd-20) | 0.20 g |
| Colloidal silica | 0.12 g |
| (Snowtex ZL: particle size 70 to 100 μm, manufactured by Nissan Chemical Industries, Ltd.) | |
| Water | 100 g |

The pH of the coating solution was adjusted to 6 using a 10 wt % aqueous KOH solution and the coating solution was coated on both surfaces of the support and dried at 180° C. for 2 minutes to give a dry thickness of 0.9 μm.

Second Undercoat Layer

| | |
|---|---|
| Gelatin | 1 g |
| Methyl cellulose | 0.05 g |
| Compound (Cpd-21) | 0.02 g |
| $C_{12}H_{25}O(CH_2CH_2O)_{10}H$ | 0.03 g |
| Proxel | $3.5 \times 10^{-3}$ g |
| Acetic acid | 0.2 g |
| Water | 100 g |

The coating solution was coated on the first undercoat layers and dried at 170° C. for 2 minutes to give a dry thickness of 0.1 μm.

Core-shell Type Vinylidene Chloride Copolymer 1

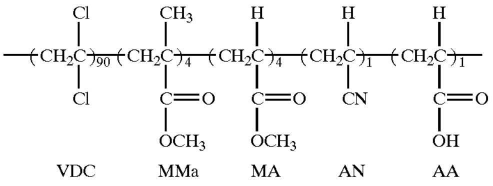

Core: VDC/MMA/MA (80 wt %)
Shell: VDC/AN/AA (20 wt %)
Average grain size: 70 nm

Cpd-20

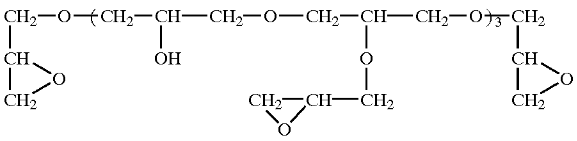

Cpd-21

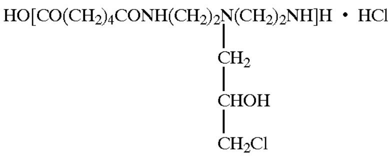

Coating Method

On the support on which the above-mentioned undercoat layers had been coated, four layers comprising a UL layer, an emulsion layer, a lower protective layer and an upper protective layer were coated on the support in that order as the emulsion layer side by simultaneous multilayer coating by a slide bead coater method at 35° C. while adding a hardening agent, and the sample was passed through a cold air setting zone (5° C.). Subsequently, on the side of the support opposite to the emulsion layer side, an electrically conductive layer and a back layer were coated in that order by simultaneous multilayer coating by a curtain coater method while adding a hardening agent, and the sample was passed through a cold air setting zone (5° C.). At the points when the sample had passed the respective setting zones the coating solutions had set adequately. Subsequently, both surfaces were simultaneously dried in a drying zone under the drying conditions below. After coating the back layer side, the sample was transported without making contact with any material, including rollers, until it was wound up. The coating speed at this time was 200 m/min.

Drying Conditions

After the layers had set, the sample was dried with dry air at 30° C. until the ratio by weight of water to gelatin became 800% and then with dry air at 35° C./30% until it changed from 800% to 200%; the application of the dry air was continued. 30 seconds after the surface temperature became 34° C., the sample was dried with air at 48° C./2% for 1 minute. The drying time was 50 seconds from the start of drying to the water to gelatin ratio becoming 800%, 35 seconds for the ratio changing from 800% to 200%, and 5 seconds from the ratio being 200% to the completion of drying.

The sensitive material was wound up at 25° C. and 55%, and the roll was subjected to a heat treatment at 33° C. for 72 hours. The humidity level of the sensitive material was measured at 45%. The pH of the film surface on the emulsion layer side of the sample so obtained was 5.5 to 5.8, and the pH of the film surface on the back layer side was 6.0 to 6.5. The absorption spectra of the emulsion layer side and the back layer side were as shown in FIG. 1. Measurement of the absorption spectra was carried out using a model U-3500 spectrophotometer manufactured by Hitachi, Ltd. by removing the coating of a sample on the side opposite to the side that was to be measured and placing the sample in a 200 mmϕ integrating sphere arranged in a sample chamber.

Evaluation was carried out as follows.

Evaluation of Photographic Characteristics

The samples so obtained were exposed to xenon flash light for a radiation time of $10^{-6}$ S via an interference filter having a peak at 667 nm and a step wedge.

The sample was then processed using an automatic processor model FG-680A (manufactured by Fuji Photo Film Co., Ltd.) with developing solution A and fixing solution B having the formulations below under development conditions of 35° C. and 30 s.

Formulation of Developing Solution A

1 L of concentrated developing solution A

| | |
|---|---|
| Potassium hydroxide | 60.0 g |
| Diethylenetriaminepentaacetic acid | 3.0 g |
| Potassium carbonate | 90.0 g |
| Sodium metabisulfite | 105.0 g |
| Potassium bromide | 10.5 g |
| Hydroquinone | 60.0 g |
| 5-Methylbenzotriazole | 0.53 g |
| 4-Hydroxymethyl-4-methyl-1-phenyl-3-pyrazolidone | 2.3 g |
| Sodium 3-(5-mercaptotetrazol-1-yl)-benzenesulfonate | 0.15 g |
| Sodium 2-mercaptobenzimidazole-5-sulfonate | 0.45 g |
| Sodium erythorbate | 9.0 g |
| Diethylene glycol | 7.5 g |
| pH | 10.79 |

When used, 2 parts of the above concentrated solution was diluted with 1 part of water. The initial pH of the starter solution used was 10.65. A replenisher was made by diluting 4 parts of the above-mentioned concentrated solution with 3 parts of water, and its pH was 10.62.

Formulation of Fixing Solution B

1 L of concentrated fixing solution B

| | |
|---|---|
| Ammonium thiosulfate | 360 g |
| Disodium ethylenediaminetetraacetate dihydrate | 0.09 g |
| Sodium thiosulfate pentahydrate | 33.0 g |
| Sodium metabisulfite | 57.0 g |
| Sodium hydroxide | 37.2 g |
| Acetic acid (100%) | 90 g |
| Tartaric acid | 8.7 g |
| Sodium gluconate | 5.1 g |
| Aluminum sulfate | 25.2 g |
| pH | 4.85 |

When the fixing solution was used, 1 part of the above-mentioned concentrated solution was diluted with 2 parts of water. The pH of the solution used was 4.8.

Evaluation of Photographic Characteristics

The inverse of a light exposure that gave a density of 1.5 was defined as a relative sensitivity of 100, and γ was given by the equation ((1.5–0.3)/log (light exposure that gives a density of 1.5)–log (light exposure that gives a density of 0.3)). The fog was denoted by the density of an unexposed area.

Evaluation of Storage Stability of Product in Roll Form

A film sample that had a water content of 45% RH expressed as a relative humidity and that had been wound into a roll in the same manner as the product was allowed to stand at 60° C. for 10 days, and the fog was then evaluated.

Evaluation of Silver Sludge

The above-mentioned developing solution A was used to process film samples that had been blackened by 80% to give 300 sheets per day of large full size (50.8 cm×61 cm) by replenishing the solution with 50 ml and 30 ml per large full sheet in an automatic development machine, the processing was continuously carried out for 4 days, and staining of the developing tank, developing rack and developing solution of the machine were subjectively evaluated using a scale of 1 to 5. 1 and 2 on the scale denote an unacceptable level (the unacceptable level denotes a level which requires cleaning within 1 week of normal operation), 3 and 4 on the scale denote an acceptable-without-problems level, and 5 on the scale denotes a level in which no staining was formed. The photographic sensitivity was also evaluated for a case in which 50 ml was replenished.

The results are given in Table 1.

TABLE 1

| | Comparative Example | | The present invention | | |
|---|---|---|---|---|---|
| Sample No. | 1 | 2 | 3 | 4 | 5 |
| Compound of formula (I) or (II) Type | — | Mercapto-tetrazole | I-5 | I-5 | I-5 |
| Amount added (mol/Ag mol) | — | $7.6 \times 10^{-4}$ | $3 \times 10^{-4}$ | $7.6 \times 10^{-4}$ | $2 \times 10^{-3}$ |
| Sensitivity | 100 | 100 | 100 | 100 | 100 |
| γ | 25 | 25 | 25 | 25 | 25 |
| Fog | 0.04 | 0.04 | 0.04 | 0.04 | 0.04 |
| Fog after storage | 0.55 | 0.06 | 0.1 | 0.07 | 0.05 |
| Silver sludge | | | | | |
| 50 ml replenished | 2 | 3 | 4 | 4 | 4 |
| 30 ml replenished | 1 | 2 | 3 | 3 | 4 |
| Sensitivity after running with 50 ml replenished | 96 | 75 | 96 | 95 | 95 |

| | The present invention | | | |
|---|---|---|---|---|
| Sample No. | 6 | 7 | 8 | 9 |
| Compound of formula (I) or (II) Type | I-7 | II-6 | II-6 | II-6 |
| Amount added (mol/Ag mol) | $7.6 \times 10^{-4}$ | $7.6 \times 10^{-4}$ | $2 \times 10^{-3}$ | $5 \times 10^{-3}$ |
| Sensitivity | 100 | 100 | 100 | 100 |
| γ | 25 | 25 | 25 | 25 |
| Fog | 0.04 | 0.04 | 0.04 | 0.04 |
| Fog after storage | 0.06 | 0.09 | 0.07 | 0.06 |

TABLE 1-continued

| | | | | |
|---|---|---|---|---|
| Silver sludge | | | | |
| 50 ml replenished | 4 | 3 | 3 | 4 |
| 30 ml replenished | 3 | 3 | 3 | 3 |
| Sensitivity after running with 50 ml replenished | 96 | 95 | 95 | 95 |

It is clear from Table 1 that the samples of the present invention containing the compounds represented by general formulae (I) and (II) of the present invention showed an acceptable-without-problems level with satisfactory silver sludge, high contrast in photographic performance, good storage stability at high temperature, and no problem in photographic sensitivity after running.

Example 2

The same experiment as in Example 1 was carried out using solid developer (C) and solid fixing agent (D) below, and the samples having the arrangement of the present invention showed the same good performance as did Example 1.

Formulation of Solid Developer (C)

| | |
|---|---|
| Sodium hydroxide (beads) 99.5% | 11.5 g |
| Potassium sulfite (powder) | 63.0 g |
| Sodium sulfite (powder) | 46.0 g |
| Potassium carbonate | 62.0 g |
| Hydroquinone (briquette) | 40.0 g |
| All of the components above were together made into a briquette. | |
| Diethylenetriaminepentaacetic acid | 2.0 g |
| 5-Methylbenzotriazole | 0.35 g |
| 4-Hydroxymethyl-4-methyl-1-phenyl-3-pyrazolidone | 1.5 g |
| 4-(N-Carboxymethyl-N-methylamino)-2,6-dimercaptopyrimidine | 0.2 g |
| Sodium 3-(5-mercaptotetrazol-1-yl)-benzenesulfonate | 0.1 g |
| Sodium erythorbate | 6.0 g |
| Potassium bromide | 6.6 g |
| The components above were dissolved in water to make 1 L. | |
| pH | 10.65 |

The starting materials in a powder form were general industrial products, which were used as they were, and the beads of the alkali metal salt were a commercial product.

The starting materials in briquette form were prepared using a briquetting machine by pressing a material into tabular form and then crushing it. Minor components were blended first and then briquetted.

10 L of the above-mentioned processing agent was packaged in a high density polyethylene foldable container and the outlet was sealed with an aluminum seal. Dissolution and replenishment were carried out using a dissolution and replenishment machine having an automatic unsealing mechanism disclosed in JP-A-9-80718 and JP-A-9-138495.

Formulation of Solid Fixing Agent D

| | |
|---|---|
| Agent A (solid) | |
| Ammonium thiosulfate (compact) | 125.0 g |
| Anhydrous sodium thiosulfate (powder) | 19.0 g |

-continued

| | |
|---|---|
| Sodium metabisulfite (powder) | 18.0 g |
| Anhydrous sodium acetate (powder) | 42.0 g |
| Agent B (liquid) | |
| Disodium ethylenediaminetetraacetate dihydrate | 0.03 g |
| Tartaric acid | 2.9 g |
| Sodium gluconate | 1.7 g |
| Aluminum sulfate | 8.4 g |
| Sulfuric acid | 2.1 g |

The components above of Agent B were dissolved in water to make 50 ml.

Fixing solution D was prepared by dissolving Agents A and B in water to make 1 L. The pH was 4.8.

Ammonium thiosulfate (compact) was prepared by compressing, using a roller compactor, flakes of material that had been formed by a spray drying method and crushing the compact into amorphous chips having a size of about 4 to 6 mm, and blended with anhydrous sodium thiosulfate. The other starting materials in a power form were general industrial products.

10 L each of Agent A and Agent B was separately packaged in high density polyethylene foldable containers, and the outlet for Agent A was sealed with an aluminum seal. An opening of the container for Agent B was sealed with a screw cap. Dissolution and replenishment were carried out using a dissolution and replenishment machine having an automatic unsealing mechanism disclosed in JP-A-9-80718 and JP-A-9-138495.

Example 3

The same experiment as in Example 1 was carried out using developing solution E below instead of developing solution A of Example 1, and the light-sensitive materials having the arrangement of the present invention showed the same good performance as did Example 1.

Formulation of Developing Solution E 1L of concentrated solution E

| | |
|---|---|
| Potassium hydroxide | 105.0 g |
| Diethylenetriaminepentaacetic acid | 6.0 g |
| Potassium carbonate | 120.0 g |
| Sodium metabisulfite | 120.0 g |
| Potassium bromide | 9.0 g |
| Hydroquinone | 75.0 g |
| 5-Methylbenzotriazole | 0.25 g |
| 4-Hydroxymethyl-4-methyl-1-phenyl-3-pyrazolidone | 1.35 g |
| 4-(N-Carboxymethyl-N-methylamino)-2,6-dimercaptopyrimidine | 0.3 g |
| Sodium 2-mercaptobenzimidazole-5-sulphonate | 0.45 g |
| Sodium erythorbate | 9.0 g |
| Diethylene glycol | 60.0 g |
| pH | 10.7 |

1 part of the above-mentioned concentrated solution was diluted with 2 parts of water when used. The pH of the solution used was 10.5.

Example 4

The processing of Examples 1 to 3 was carried out at a development temperature of 38° C. and a fixation temperature of 37° C. for a development time of 20 s; the same results as those in Examples 1 to 3 were obtained, and the effects of the present invention were not degraded.

Example 5

The processing of Examples 1 to 4 was carried out using an automatic development machine model FG-680AS (manufactured by Fuji Photo Film Co., Ltd.) at a linear transport speed for the light-sensitive materials of 1500 mm/min. The same results were obtained.

Although the embodiments of the present invention have been explained in detail above, the present invention can be modified in a variety of ways without departing from the spirit and scope of the claims.

What is claimed is:

1. A silver halide photographic light-sensitive material comprising:

a support having first and second opposing surfaces;

at least one light-sensitive silver halide emulsion layer provided on the first surface side; and a hydrophilic colloid layer provided on the second surface side;

wherein the hydrophilic colloid layer comprises at least one compound represented by general formula (I) or general formula (II) below, (I)

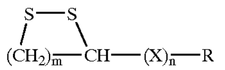

(II)

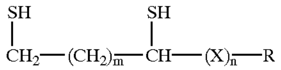

(In the formulae, X denotes a $C_1$ to $C_6$ divalent organic residue, R denotes a carboxylic acid group, a carboxylate salt group, a carboxylate ester group or a carboxylic amide group, m is 2 or 3, and n is 0 or 1.)

2. The silver halide photographic light-sensitive material according to claim 1, wherein the X in general formulae (I) and (II) is a methylene, ethylene, propylene, butylene or hexylene group.

3. The silver halide photographic light-sensitive material according to claim 1, wherein the carboxylate salt denoted by R in general formulae (I) and (II) is an alkali metal salt, an alkaline earth metal salt, an ammonium salt or an amine salt.

4. The silver halide photographic light-sensitive material according to claim 1, wherein said compound represented by general formulae (I) or (II) is added in an amount of $1\times10^{-5}$ mol/mol of silver to $1\times10^{-2}$ mol/mol of silver.

5. The silver halide photographic light-sensitive material according to claim 1, wherein said compound represented by general formulae (I) or (II) is added in an amount of $1\times10^{-4}$ mol/mol of silver to $5\times10^{-3}$ mol/mol of silver.

6. The silver halide photographic light-sensitive material according to claim 1, further comprising light-insensitive silver halide grains.

7. The silver halide photographic light-sensitive material according to claim 1, wherein said light-sensitive silver halide emulsion layer comprises at least two types of silver halide emulsion having different halogen compositions.

8. The silver halide photographic light-sensitive material according to claim 1, wherein said light-sensitive silver halide emulsion layer comprises at least two types of light-sensitive silver halide emulsion having different grain sizes.

9. The silver halide photographic light-sensitive material according to claim 8, wherein said at least two types of light-sensitive silver halide emulsion have average grain edge lengths that are different by at least 10%.

10. The silver halide photographic light-sensitive material according to claim 1, wherein the light-sensitive silver halide emulsion layer or the hydrophilic colloid layer comprises at least one type of hydrazine derivative represented by general formula (D) as a nucleating agent,

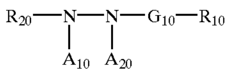

(In the formula, $R_{20}$ denotes an aliphatic group, an aromatic group or a heterocyclic group, $R_{10}$ denotes hydrogen or a blocking group, $G_{10}$ denotes a —CO—, —COCO—, —C(=S)—, —$SO_2$—, —SO—, or —$PO(R_{30})$— group ($R_{30}$ denotes the same group as $R_{10}$, and $R_{30}$ and $R_{10}$ may be identical to or different from each other), or an iminomethylene group. $A_{10}$ and $A_{20}$ both denote hydrogen or one thereof denotes hydrogen and the other thereof denotes a substituted or unsubstituted alkylsulfonyl group, a substituted or unsubstituted arylsulfonyl group, or a substituted or unsubstituted acyl group.)

11. The silver halide photographic light-sensitive material according to claim 1, wherein the light-sensitive silver halide emulsion layer or the hydrophilic colloid layer comprises an amine derivative, an onium salt, a disulfide derivative or a hydroxymethyl derivative as a nucleation accelerator.

12. A method for processing the silver halide photographic light-sensitive material according to claim 1, wherein the amount of developing solution replenished is 200 ml or less per $m^2$ of the light-sensitive material.

13. The method according to claim 12 for continuously processing a silver halide photographic light-sensitive material, wherein the developing solution comprises a dihydroxybenzene series developing agent and an auxiliary developing agent that shows superadditivity therewith.

14. The method for processing a silver halide photographic light-sensitive material according to claim 12, wherein the developing solution comprises as a developing agent a combination of a dihydroxybenzene and/or an ascorbic acid derivative and a 1-phenyl-3-pyrazolidone or a p-aminophenol.

15. The method for processing a silver halide photographic light-sensitive material according to claim 12, wherein said developing solution has a pH in the range of 9.0 to 12.0.

16. The method for processing a silver halide photographic light-sensitive material according to claim 12, wherein said developing solution has a pH in the range of 9.0 to 11.0.

17. The method for processing a silver halide photographic light-sensitive material according to claim 12, wherein the amount of developing solution replenished is in the range of 30 to 200 ml per $m^2$ of the light-sensitive material.

18. The method for processing a silver halide photographic light-sensitive material according to claim 12, wherein the amount of developing solution replenished is in the range of 30 to 180 ml per $m^2$ of the light-sensitive material.

* * * * *